(12) United States Patent
Unruh

(10) Patent No.: US 9,520,889 B2
(45) Date of Patent: Dec. 13, 2016

(54) APPARATUS AND METHOD FOR COMBINING MULTIPLE CHARGE PUMPS IN PHASE LOCKED LOOPS

(71) Applicant: BROADCOM CORPORATION, Irvine, CA (US)

(72) Inventor: Gregory Alyn Unruh, San Clemente, CA (US)

(73) Assignee: BROADCOM CORPORATION, Irvine, CA (US)

( * ) Notice: Subject to any disclaimer, the term of this patent is extended or adjusted under 35 U.S.C. 154(b) by 0 days.

(21) Appl. No.: 14/626,663

(22) Filed: Feb. 19, 2015

(65) Prior Publication Data

US 2016/0211855 A1   Jul. 21, 2016

Related U.S. Application Data

(60) Provisional application No. 62/105,618, filed on Jan. 20, 2015.

(51) Int. Cl.
| | |
|---|---|
| *H04B 1/38* | (2015.01) |
| *H03L 7/197* | (2006.01) |
| *H03L 7/087* | (2006.01) |
| *H02M 3/07* | (2006.01) |
| *H03K 3/013* | (2006.01) |
| *H04B 1/40* | (2015.01) |

(52) U.S. Cl.
CPC .............. *H03L 7/1974* (2013.01); *H02M 3/07* (2013.01); *H03K 3/013* (2013.01); *H03L 7/087* (2013.01); *H04B 1/40* (2013.01)

(58) Field of Classification Search
CPC ...... H03L 7/1976; H03L 7/087; H03L 7/0895; H03L 7/1974; H03L 7/0893; H03L 7/093; H03L 7/0816; H03L 7/23; H03C 3/0991; H03C 3/0966
USPC ........ 375/219, 376, 373, 375; 327/155, 146, 327/115, 105, 147, 117, 148, 156, 157; 455/264, 260; 331/11, 25
See application file for complete search history.

(56) References Cited

U.S. PATENT DOCUMENTS

| | | | | |
|---|---|---|---|---|
| 2002/0136341 | A1* | 9/2002 | Huh ........................ | H03L 7/087 375/376 |
| 2003/0215042 | A1* | 11/2003 | Gauthier ................... | G06F 1/10 375/376 |
| 2004/0119514 | A1* | 6/2004 | Karlquist ............. | H03C 3/0908 327/158 |
| 2007/0121710 | A1* | 5/2007 | Chien .................... | H03L 7/1976 375/215 |
| 2009/0074123 | A1* | 3/2009 | Hsueh ..................... | H03L 7/087 375/360 |
| 2012/0074997 | A1* | 3/2012 | Kim ........................ | H03L 7/081 327/157 |

(Continued)

*Primary Examiner* — Leila Malek
(74) *Attorney, Agent, or Firm* — Oblon, McClelland, Maier & Neustadt, L.L.P.

(57) ABSTRACT

A frequency synthesizer includes circuitry configured to generate two or more feedback clocks based on the oscillation signals output from a voltage-controlled oscillator. The circuitry also modulates the feedback clocks based on fractional offsets from a reference clock frequency for input into two or more phase and frequency detectors. Multiple charge pump circuits receive inputs from these phase and frequency detectors. The current from these charge pumps is summed and input to a low pass filter. The output of the filter represents an average of the time difference between the reference clock and the multiple feedback clocks.

19 Claims, 24 Drawing Sheets

(56) References Cited

U.S. PATENT DOCUMENTS

2013/0300467 A1* 11/2013 Eldredge .................. H03L 7/08
327/156

* cited by examiner

APPARATUS AND METHOD FOR COMBINING MULTIPLE CHARGE PUMPS IN PHASE LOCKED LOOPS

BACKGROUND

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

Fractional frequency synthesizers have a phase locked loop (PLL) topology that allows for fractional adjustments of the feedback oscillation via a feedback fractional N divider. The fractional adjustments of the fractional N divider allow for fine tuning of the local oscillation such that, for example, a particular channel may be tuned, a particular intermedia frequency may be achieved, etc. While a fractional frequency synthesizer allows for fine tuning of a local oscillation, its accuracy is limited by the linearity of the components included in the fractional frequency synthesizer.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein.

DETAILED DESCRIPTION

Figure 1A:
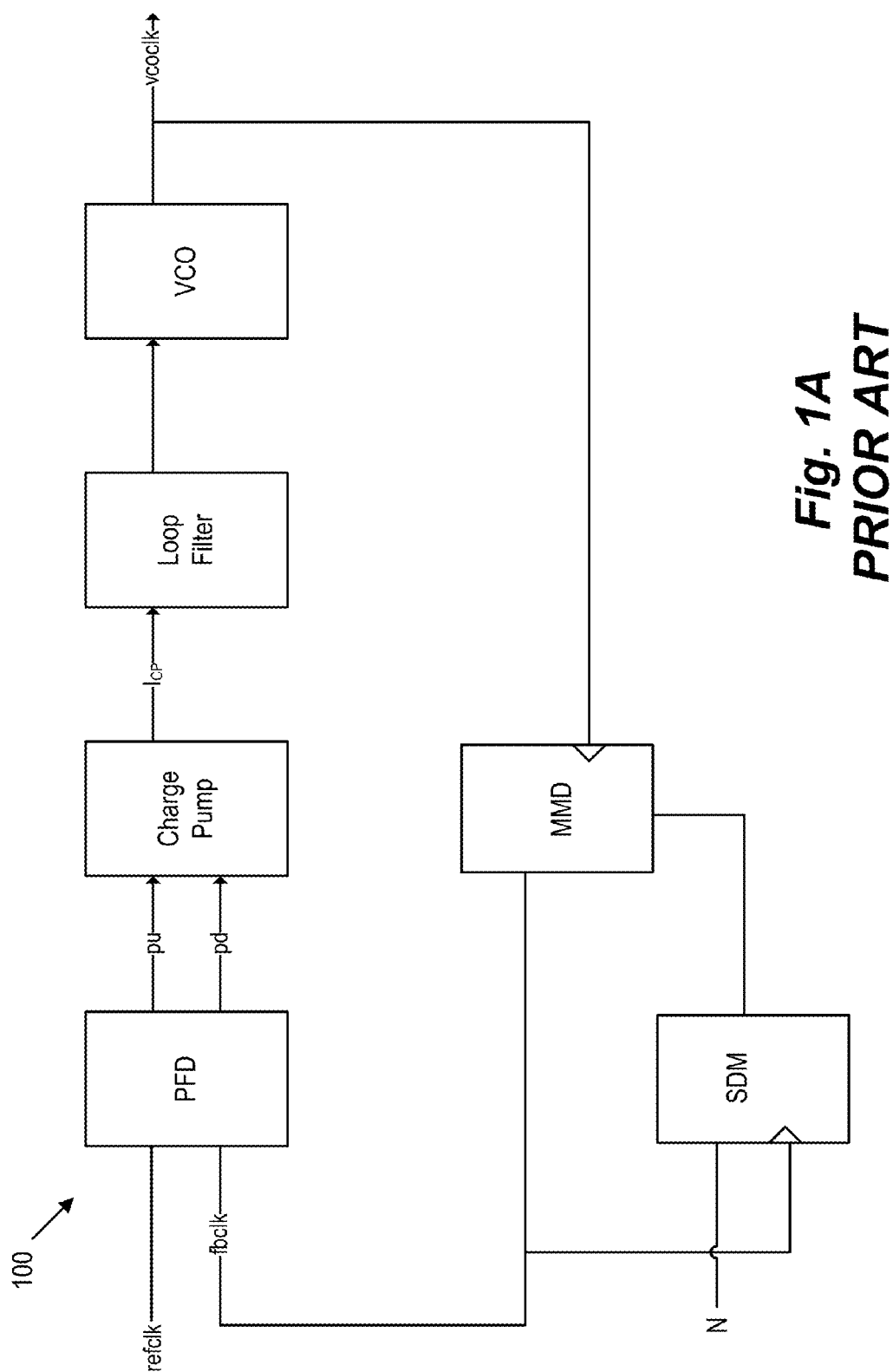
FIG. 1A is an exemplary schematic diagram of a prior art fractional phase locked loop, according to certain embodiments.

In the drawings, like reference numerals designate identical or corresponding parts throughout the several views. Further, as used herein, the words "a," "an" and the like generally carry a meaning of "one or more," unless stated otherwise. The drawings are generally drawn to scale unless specified otherwise or illustrating schematic structures or flowcharts.

Furthermore, the terms "approximately," "approximate," "about," and similar terms generally refer to ranges that include the identified value within a margin of 20%, 10%, or preferably 5%, and any values therebetween.

Aspects of this disclosure are directed to frequency synthesizers, such as phase locked loops (PLLs), having multiple charge pumps and circuitry configured to reduce spurs and phase noise that occur due to quantization errors resulting from fractional division rates. In an exemplary embodiment, a frequency synthesizer includes circuitry configured to generate two or more feedback clocks based on the oscillation signals output from a voltage-controlled oscillator. The circuitry also modulates the feedback clocks based on fractional offsets from a reference clock frequency for input into two or more phase and frequency detectors.

In another exemplary embodiment, a frequency synthesizing method includes generating, via circuitry, two or more feedback clocks based on the oscillation signals output from the voltage-controlled oscillator; modulating, via the circuitry, the two or more feedback clocks based on the fractional offsets from the reference clock frequency to input into two or more phase and frequency detectors driving a plurality of charge pumps.

In another exemplary embodiment, a frequency synthesizing method includes generating, via circuitry, two or more feedback clocks based on the oscillation signals output from the voltage-controlled oscillator; modulating, via the circuitry, the two or more feedback clocks based on the fractional offsets from the reference clock frequency to input into two or more phase and frequency detectors driving a plurality of charge pumps; and generating, via the circuitry, timing offsets between the two or more feedback clocks so that at least one of the feedback clocks leads the reference clock and at least one of the feedback clocks lags the reference clock In another exemplary embodiment, a radio includes a transmitter operably coupled to convert outbound data into outbound radio frequency (RF) signals based on a transmitter local oscillation; a receiver operably coupled to convert inbound RF signals into inbound data based on a receiver local oscillation; and a frequency synthesizer operably coupled to produce the transmitter local oscillation and the receiver local oscillation.

FIG. 1A is an exemplary schematic diagram of a prior art fractional PLL 100, according to certain embodiments. The PLL 100 includes a phase and frequency detector (PFD), charge pump (CP), loop filter (LF), voltage control oscillator (VCO), and a feedback clock generator in a feedback loop that includes divider circuitry such as a multi-modulous divider (MMD) and a sigma-delta modulator (SDM). The PFD is a phase detector (PD) configured to determine that input signals with higher frequencies are leading the input signals having lower frequencies.

For example, the PFD receives input signals from a reference clock (refclk) and a feedback clock (fbclk). If the fbclk has a higher frequency than the refclk, then the PFD determines that the fbclk is leading the refclk, resulting in the pump down (pd) signal output from the PFD being active for longer durations than the pump up (pu) signal. If the fbclk has a lower frequency than the refclk, then the PFD determines that the refclk is leading the fbclk, resulting in the pu signal output from the PFD being active for longer durations than the pd signal. After some time interval, generally referred to as the Frequency Lock Time, the fbclk signal arrives at the same frequency as the refclk signal, and the PLL is regarded as being frequency locked. If the fbclk has the same frequency as the refclk, and one of its rising edges arrives at the PFD before the corresponding rising edge of the fbclk, then the PFD determines that the refclk is leading the fbclk, resulting in the pu signal output from the PFD being active for a longer duration than the pd signal. If the fbclk has the same frequency as the refclk, and one of its rising edges arrives at the PFD after the corresponding rising edge of the fbclk, then the PFD determines that the refclk is leading the fbclk, resulting in the pd signal output from the PFD being active for a longer duration than the pu signal.

The CP is a current source that is switched on and off by input pulses. In certain embodiments, the charge pump output current, $I_{CP}$, for an input pulse is equal to current times pulse width. For example, a positive current source can be switched on by a pu signal from the PFD, and a negative current source is switched on by a pd signal from the PFD.

The LF is an analog or digital filter having a transfer function configured to optimize the response of the PLL 100. In some implementations, the LF integrates at low frequencies, has a flat response near the desired unity-gain frequency in the loop, and has a low pass response at higher frequencies. The VCO is an oscillator configured so that the output frequency is controlled by the input, such as the output of the LF. Other inputs to the VCO may include control signals that set a frequency range over which the VCO may be controlled by the LF.

The feedback loop includes divider circuitry such as the MMD and the SDM. The MMD produces an output clock, where the time between output clocks is an integer multiple of input clock periods. A control input selects between multiple divider rates on a cycle-by-cycle basis. In addition, the SDM includes circuitry that computes a residual phase error (residue) caused by MMD quantization, and the SDM filters the residue to produce a sequence of divider rates. The divider circuitry in the feedback loop are based on counter circuits that generate pulses at integer multiples of an output clock of the VCO, and the output frequency from the VCO can be adjusted into fractional step sizes that are smaller than the frequency of the reference clock (refclk). The fractional step sizes are based on a fractional division rate, N, that is input into the SDM. Each feedback clock (fbclk) signal is generated on a leading VCO clock (vcoclk) edge, which introduces quantization errors due to time differences between each feedback clock and an ideal feedback clock. In turn, the quantization errors introduce phase jitter and spurs at the output clock that degrade the performance of the PLL 100.

Figure 1B:
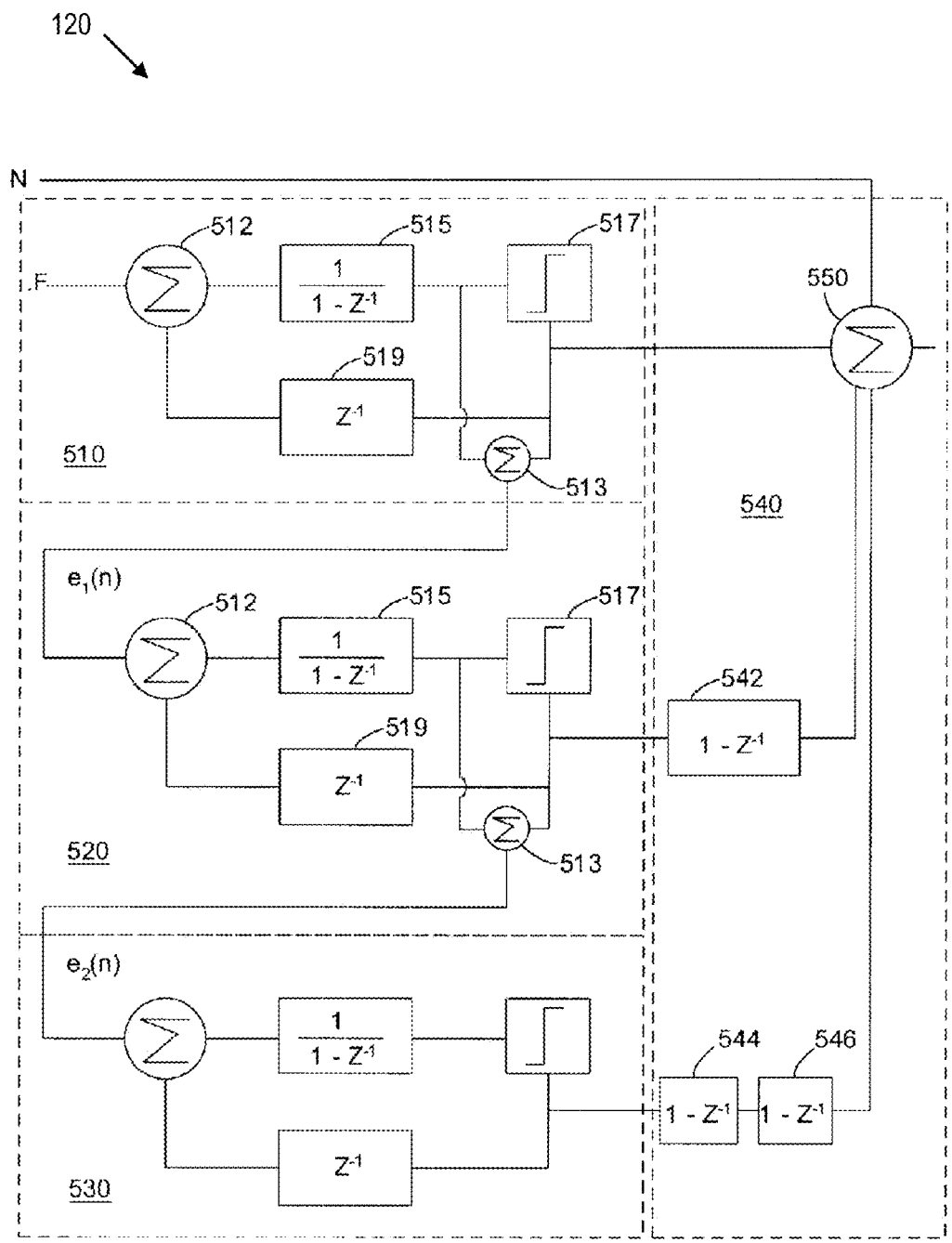
FIG. 1B is an exemplary schematic diagram of a prior art multi-stage sigma-delta modulator, according to certain embodiments.

FIG. 1B is an exemplary schematic diagram of a prior art multi-stage sigma-delta modulator (SDM) 120, according to certain embodiments. The SDM 120 can be implemented in the PLL 100 and any other PLL described herein. The SDM 120 includes three identical stages, 510, 520, and 530, with summers 512 and 513, an integrator 515, a quantizer 517, and a delay circuit 519. The digital cancellation circuit 540 includes a first differentiator 542 coupled to the output of the second stage 520, second and third differentiators 544 and 546 coupled in cascade to the output of the third stage 530, and summer circuitry 550 coupled to the outputs of the first state 510, the first differentiator 542, and the third differentiator 546. A series of error terms, $e_1(n)$ and $e_2(n)$, arising different states of the SDM 120, are cancelled as the terms are combined. The SDM 120 modulates a fractional portion of the division rate, F, and adds the result to the integer portion of the division rate, N, at the summer 500.

Figure 2:
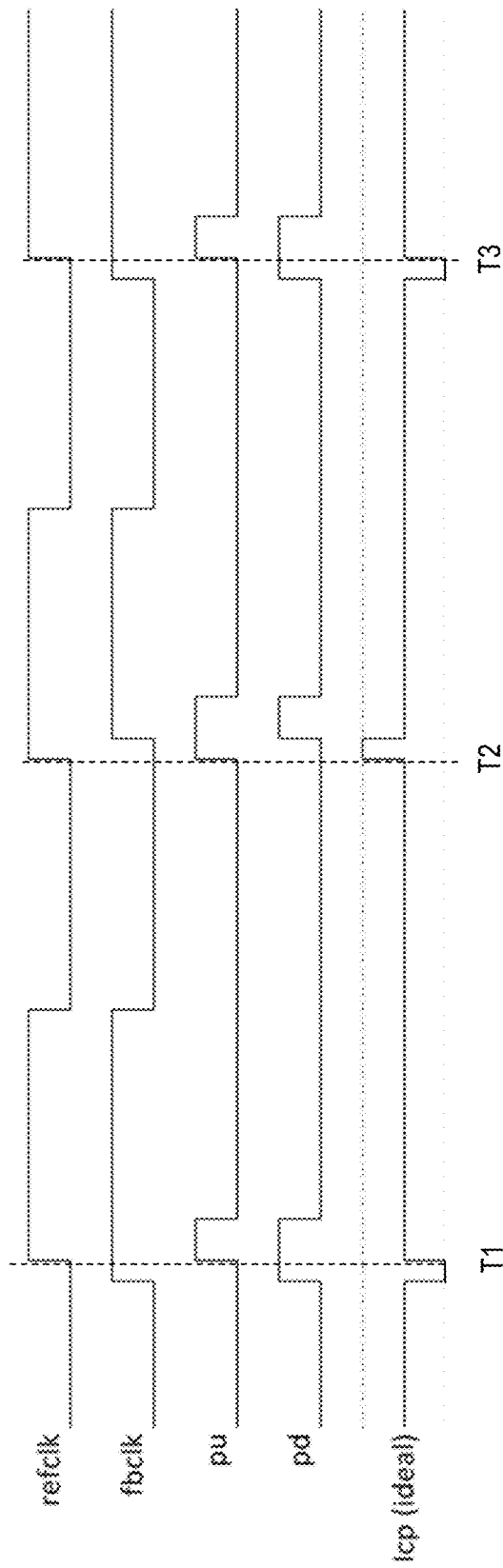
FIG. 2 is an exemplary timing diagram for the prior art fractional phase locked loop, according to certain embodiments.

FIG. 2 is an exemplary timing diagram for the prior art fractional PLL 100, according to certain embodiments. The timing diagram includes signals for the refclk, fbclk, pu signal, pd signal, and $I_{CP}$. The timing diagram includes the refclk signal that commences clock cycles at times T1, T2, and T3. The pu/pd signals are output from the PFD in response based on the refclk and fbclk input signals. An average feedback phase of zero is produced by alternating when fbclk leads and lags the refclk. For example, during clock cycles when the fbclk leads the refclk, such as at times T1 and T3, the $I_{CP}$ is negative based on net positive pu/pd signals output from the PFD. During clock cycles when the fbclk lags the refclk, such as at time T2, the $I_{CP}$ is positive based on net negative pu/pd signals output from the PFD.

Figure 3:
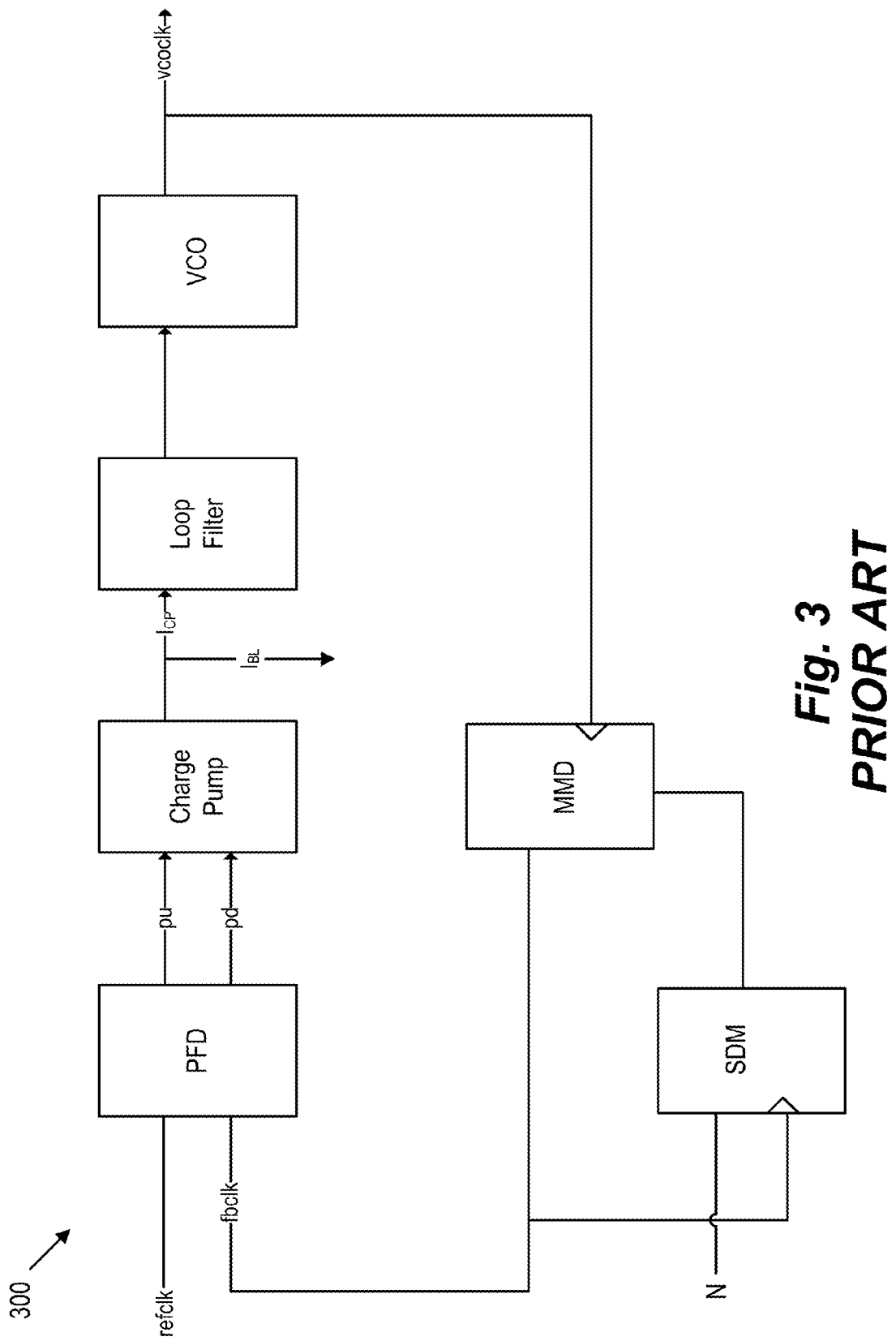
FIGS. 3 and 4 are schematic illustrations of prior art fractional phase locked loops, according to certain embodiments.

FIG. 3 is an exemplary schematic diagram for a prior art fractional PLL 300, according to certain embodiments. The PLL 300 includes the PFD, CP, LF, VCO, MMD, and SDM as described with respect to PLL 100 in FIG. 1A. The PLL 300 includes a bleeding current ($I_{bl}$) at the output of the CP in order to bias the PFD and CP into their linear regions, which reduces jitter of the output signal from the PLL 300. However, spurs may be present in the output signal at multiples of the reference clock frequency.

Figure 4:
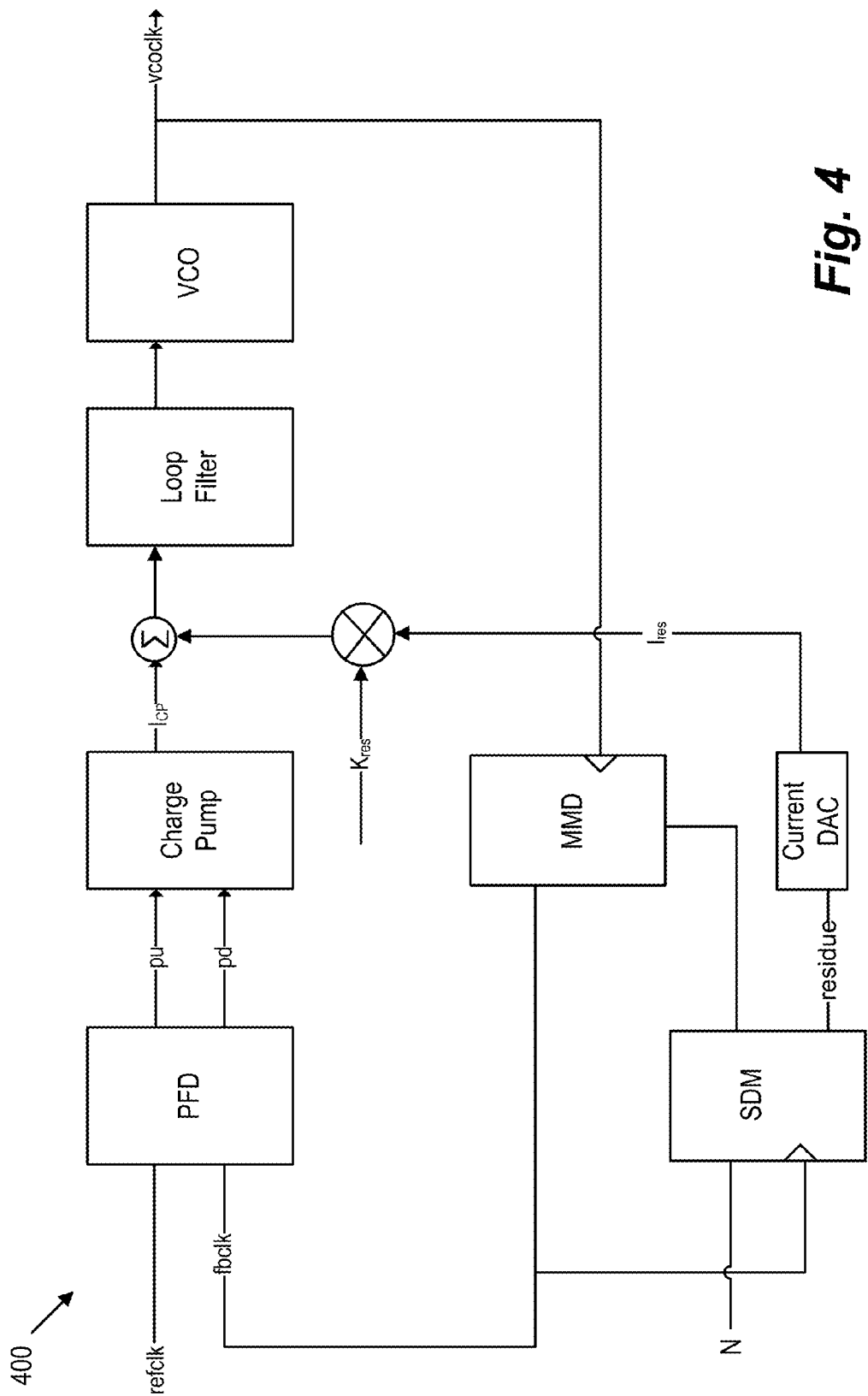

FIG. 4 is an exemplary schematic diagram for a prior art fractional PLL 400, according to certain embodiments. The PLL 400 includes the PFD, CP, LF, VCO, MMD, and SDM as described with respect to PLL 100 in FIG. 1A. The residue output from the SDM of the PLL 400 drives a current digital-to-analog converter (DAC). A multiplier constant ($K_{res}$) is applied to the output of the current DAC, $I_{res}$, which is summed with the ideal charge pump current ($I_{CP}$) to bias the PFD and CP into their linear regions, which reduces jitter of the output signal from the PLL 400. However, the optimal value of $K_{res}$ may be difficult to determine, and any error in the $K_{res}$ degrades performance of the PLL 400.

Figure 5:
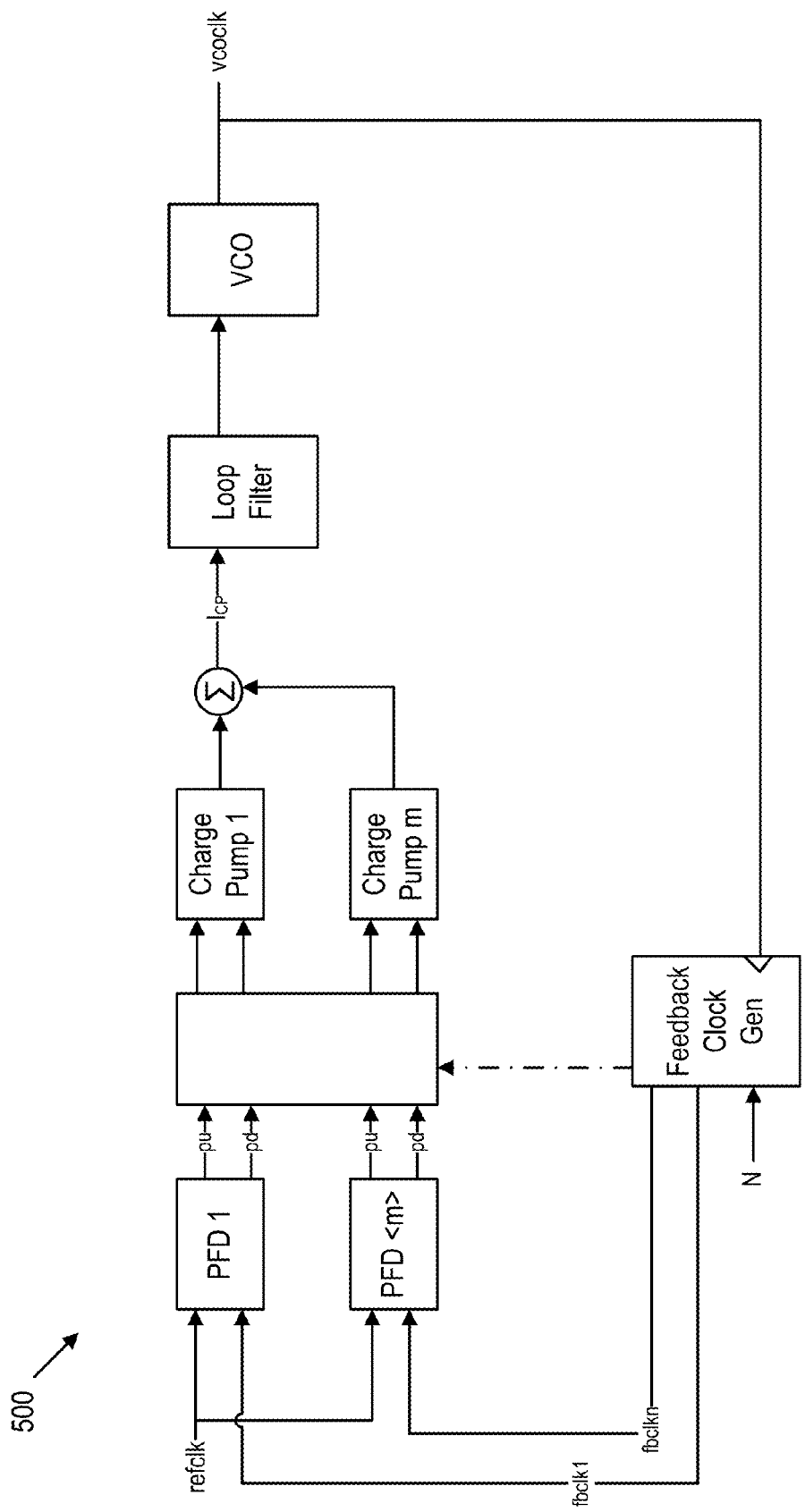
FIG. 5 is a schematic illustration of an exemplary fractional phase locked loop having multiple charge pumps, according to certain embodiments.

FIG. 5 is a schematic illustration of an exemplary fractional PLL 500 having multiple charge pumps, according to certain embodiments. The fractional analog PLL 500 includes two or more CPs and circuitry configured to mitigate the effects of quantization errors in the feedback clocks. The CPs are driven by two or more PFDs, which determine phase and frequency differences between the reference clock and each feedback clock. In addition, for each rising reference clock signal, the output signal from the VCO is based on the sum of the output currents from all of the CPs, which are processed by a loop filter. The PLL also includes circuitry that generates the two or more feedback clocks at different phase offsets in order to minimize quantization errors. Details regarding additional embodiments related to the PLL 500 are discussed further herein.

Figure 6A:
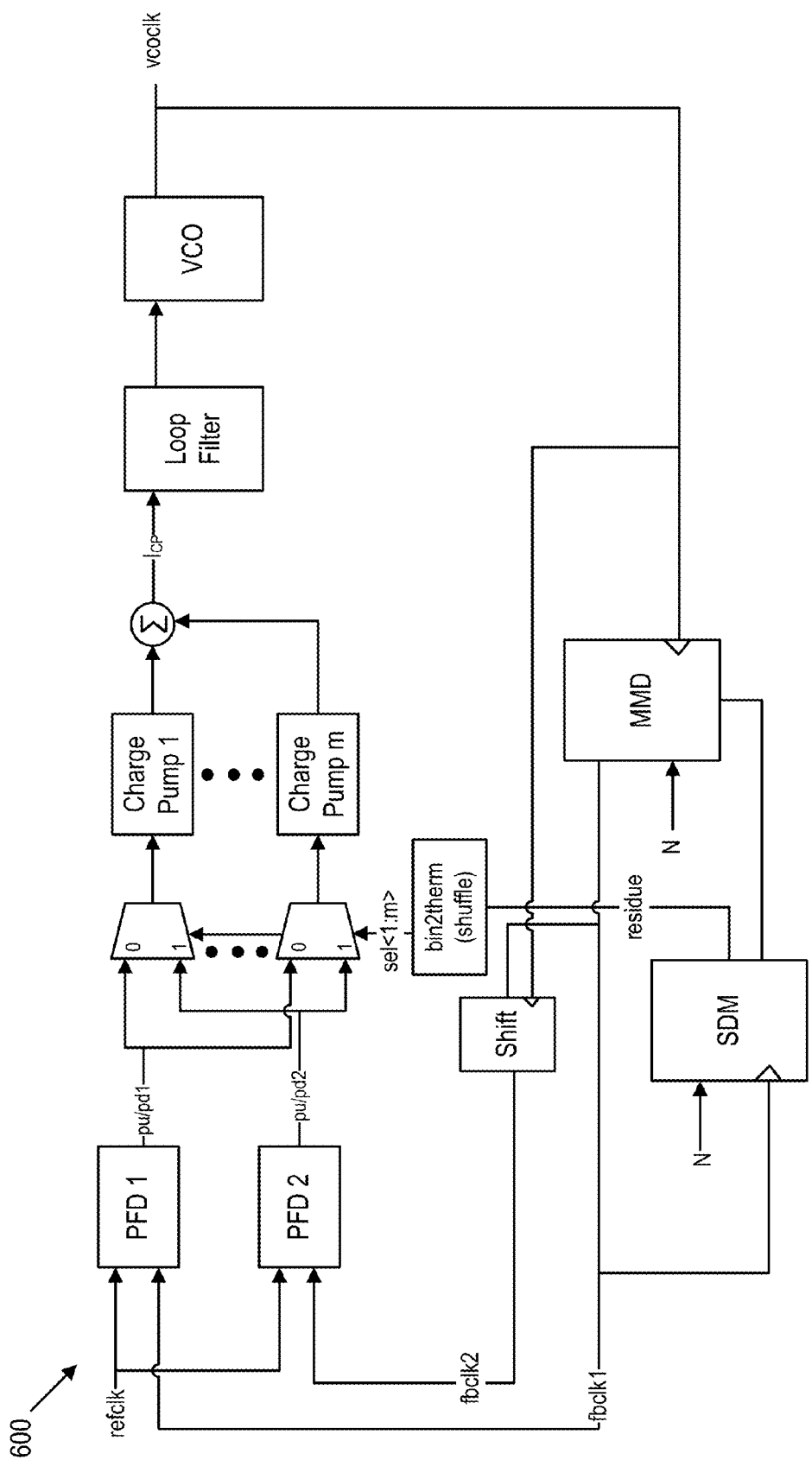
FIGS. 6A and 6B are schematic illustrations of exemplary fractional phase locked loops having multiple charge pumps, according to certain embodiments.

FIG. 6A is a schematic illustration of an exemplary fractional PLL 600 having multiple charge pumps, according to certain embodiments. The PLL 600 is an exemplary embodiment of the PLL 500 and has two feedback clocks, fbclk1 and fbclk2, that are input into one of two PFDs (PFD1 and PFD2) with the reference clock signal also being input into each of the two PFDs. For example, fbclk1 is input into PFD1 and fbclk2 is input into PFD2. The feedback loop of the PLL 600 includes a MMD, SDM, and circuitry to generate the feedback clocks such that one feedback clock is earlier than the reference clock, and the other feedback clock is later than the reference clock. In addition, fbclk1 and fbclk2 are separated by one vcoclk cycle, according to one implementation. The PFDs output either a pu or a pd signal based on the feedback clock either leading or lagging the reference clock. With respect to PLL 600, the pu/pd signals output from PFD1 are referred to as pu1/pd1, and the pu/pd signals output from PFD2 are referred to as pu2/pd2.

In some implementations, the pu/pd signals are output to two or more multiplexers that select one of the output signals from PFD and PFD2. Each multiplexer has a corresponding CP, and the output signals selected by the multiplexers are input into the corresponding CPs. By selecting the PFD1 or PFD2, the multiplexers are selecting either an earlier feedback clock or a later feedback clock to drive the CPs.

In an exemplary embodiment, the PLL 600 includes sixteen CPs and sixteen multiplexers, but greater or fewer number of CPs and multiplexers can also be used, such as 4, 8, 32, 64, and the like. The number of multiplexers selecting PFD1 and the number of multiplexers selecting PFD2 are based on the residue output from the SDM. Also, a binary-to-thermometer decoder (bin2therm) designates which of the multiplexers select the pu/pd signal from PFD1 and which of the multiplexers select the pu/pd signal from PFD2. Different types of shuffler circuits can also be applied to the bin2therm output to randomize any possible mismatches between the CPs, For the PLL 600 having sixteen CPs and 16 multiplexers, if the residue output from the SDM is equal to four, twelve of the multiplexers select the pu/pd signal associated with an earlier clock edge, and four of the multiplexers select the pu/pd signal associated with a later clock edge. For example, twelve of the multiplexers select the pu1/pd1 signal from PFD1, and four of the multiplexers select the pu2/pd2 signal from PFD2. Therefore, the resultant sum of the outputs from the CPs may be equal to a weighted offset between the CP output based on an earlier clock and the CP output based on a later clock edge, which allows the PLL 600 to interpolate between quantization steps.

In other implementations of the PLL 500, M number of PFD circuits each feed one of M CP circuits and M selector circuits choose between the two feedback clock signals that are input into the M PFD circuits.

Another variation of the PLL 500 is configured so that half of the feedback clocks generated by the MMD and the associated circuitry are delayed by an integer number of vcoclk cycles in order to ensure that half of the feedback clocks lead the reference clock and the other half of the feedback clocks lag the reference clock.

Figure 6B:
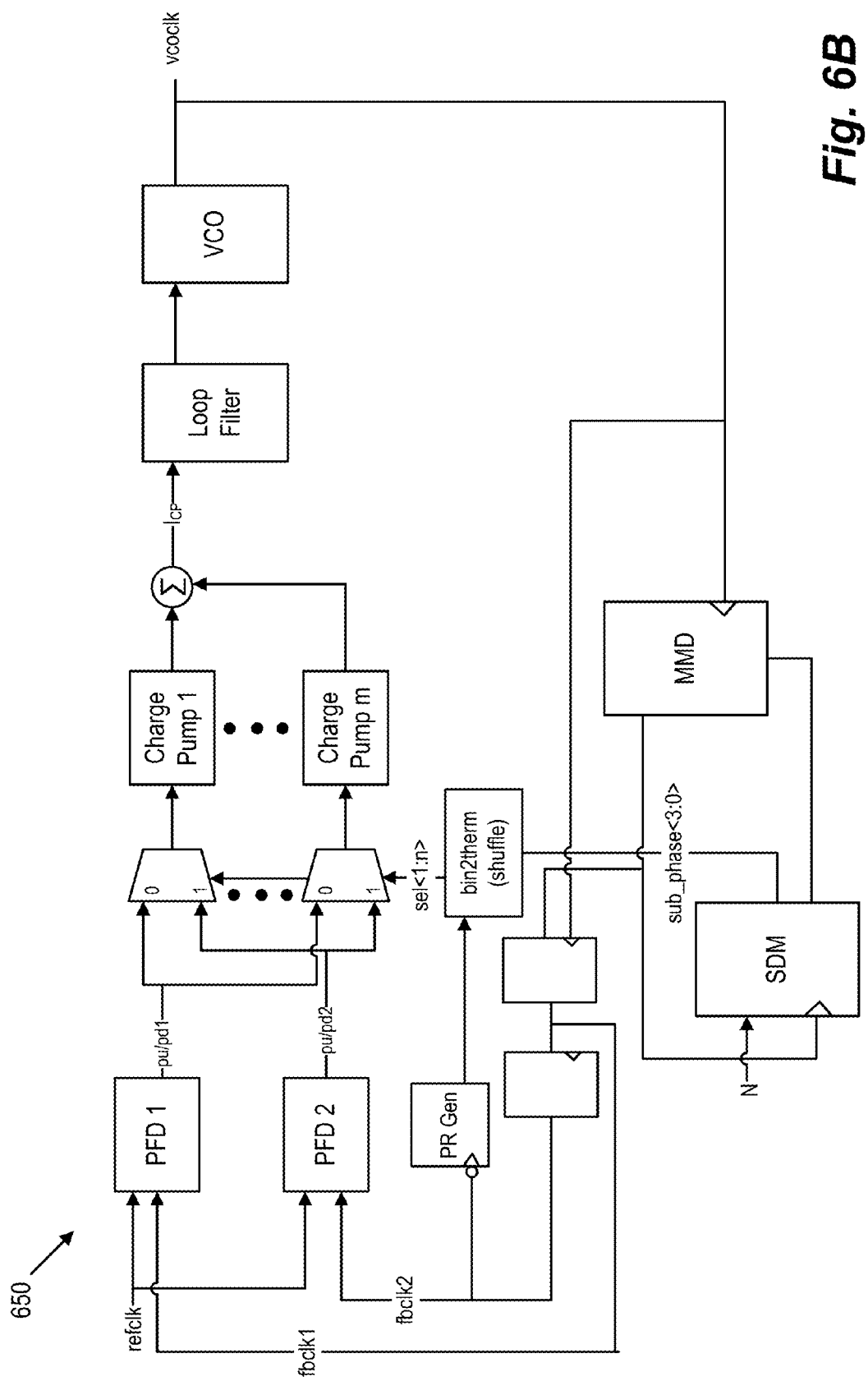

FIG. 6B is a schematic illustration of an exemplary fractional PLL 650 having multiple charge pumps, according to certain embodiments. In some implementations, the CPs used in fractional PLLs may have manufacturing differences and deterministic differences due to layout that cause variations in the output currents of the CPs. The differences between the CPs may cause the performance of the fractional PLLs to be degraded by producing low frequency phase noise spurs corresponding to the fractional offset and an amount of output variation between the CPs in the fractional PLL. The performance degradation can be reduced by dithering, or randomizing, the phase selection between all of the CPs in the fractional PLL.

Like the PLL 600, the PLL 650 has two feedback clock s, fbclk1 and fbclk2, that are input into one of two PFDs (PFD1 and PFD2) with the reference clock signal also being input into each of the two PFDs. The feedback loop of the PLL 650 also includes a MMD, SDM, and circuitry to generate the feedback clocks such that one feedback clock is earlier than the reference clock, and the other feedback clock is later than the reference clock. In addition, fbclk1 and fbclk2 are separated by one vcoclk cycle, according to one implementation.

The PLL 650 also includes the two or more multiplexers that select one of the output signals from PFD1 and PFD2 to be input into the corresponding CPs. In addition to the bin2therm shuffler that designates which of the multiplexers select the pu/pd signal from PFD1 and which of the multiplexers select the pu/pd signal from PFD2 based on phase residue sub_phase<3:0> output from the SDM, the PLL 650 also includes a pseudorandom generator (PR Gen) that ensures that unique sets of CPs are selected at each reference clock cycle. The randomization of CP selection imposed by the pseudorandom generator can reduce the spurs in phase noise caused by the manufacturing and deterministic differences between the CPs in the PLL 650.

Figure 6C:
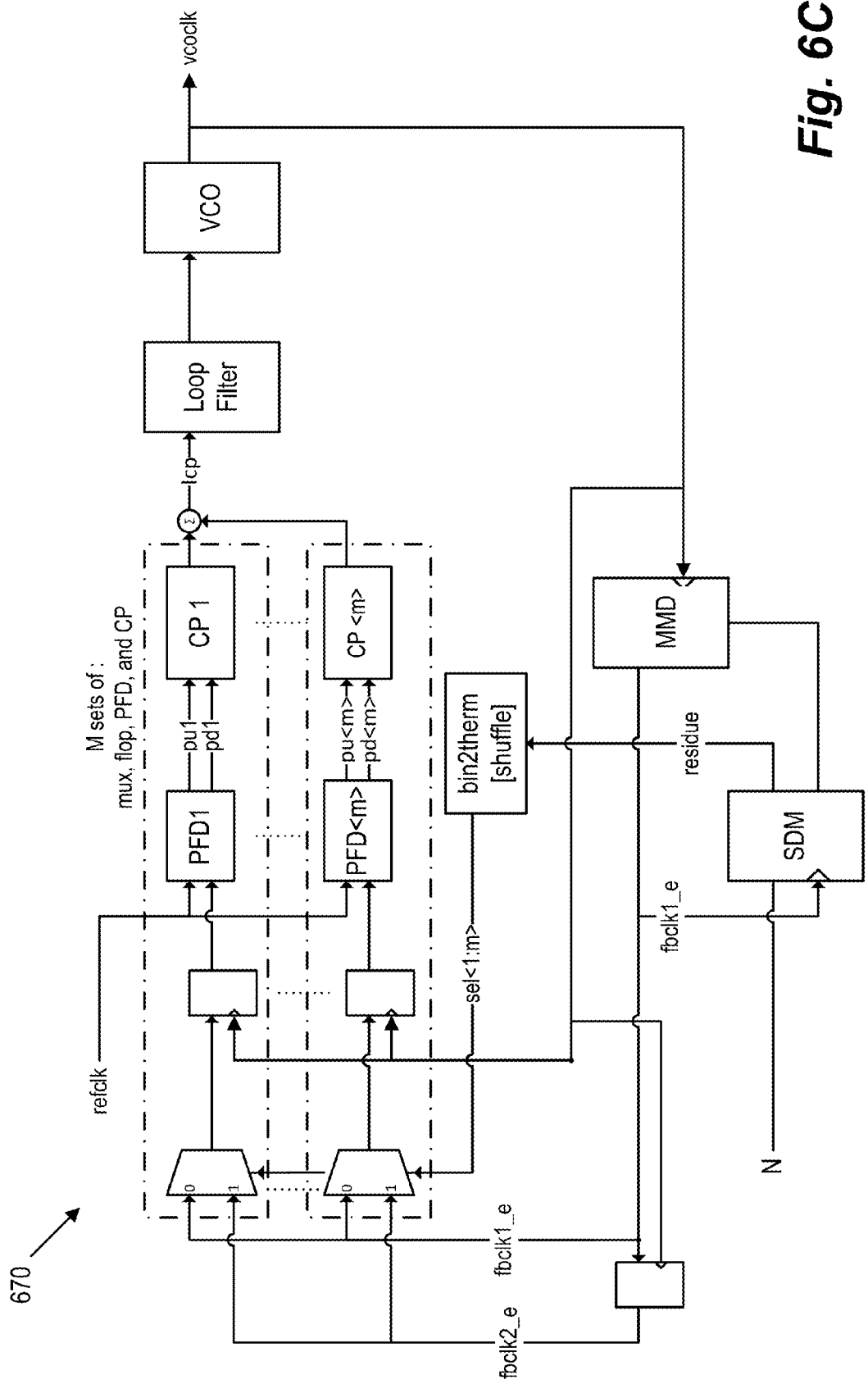
FIG. 6C is a schematic illustration of an exemplary fractional phase locked loop having multiple charge pumps, according to certain embodiments.

FIG. 6C is a schematic illustration of an exemplary fractional PLL 670 having multiple charge pumps, according to certain embodiments. The PLL 670 is another variation of the PLL 500 that includes M feedback clocks that that drive M sets of PFD and CP circuits. An input to a final retiming circuit, which has M flops driven by a common clock, selects between two feedback clock enable signals (fbclk1_e and fbclk2_e), producing the M feedback clocks. Each clock is selected by one output of a bin2therm circuit, as described with respect to FIG. 6A.

The feedback loop of the PLL 670 also includes a MMD, SDM, and circuitry to generate the feedback clock enable signals, fbclk1_e and fbclk2_e. In addition, fbclk1_e and fbclk2_e are separated by one vcoclk cycle, according to one implementation. For example, the output of the bin2therm decoder determines which of the multiplexers select the fbclk1_e signal and which of the multiplexers select the fbclk2_e signal. The outputs from the M multiplexers are input into corresponding M flip-flop circuits, and the outputs of the M flip-flop circuits are then input as feedback clocks into the corresponding M PFD's along with the refclk signal. The PFDs output either a pu or a pd signal based on the feedback clock either leading or lagging the reference clock. The output currents from the M CP's are summed into a loop filter, and the VCO outputs the vcoclk signal based on the filtered CP currents.

Figure 7A:
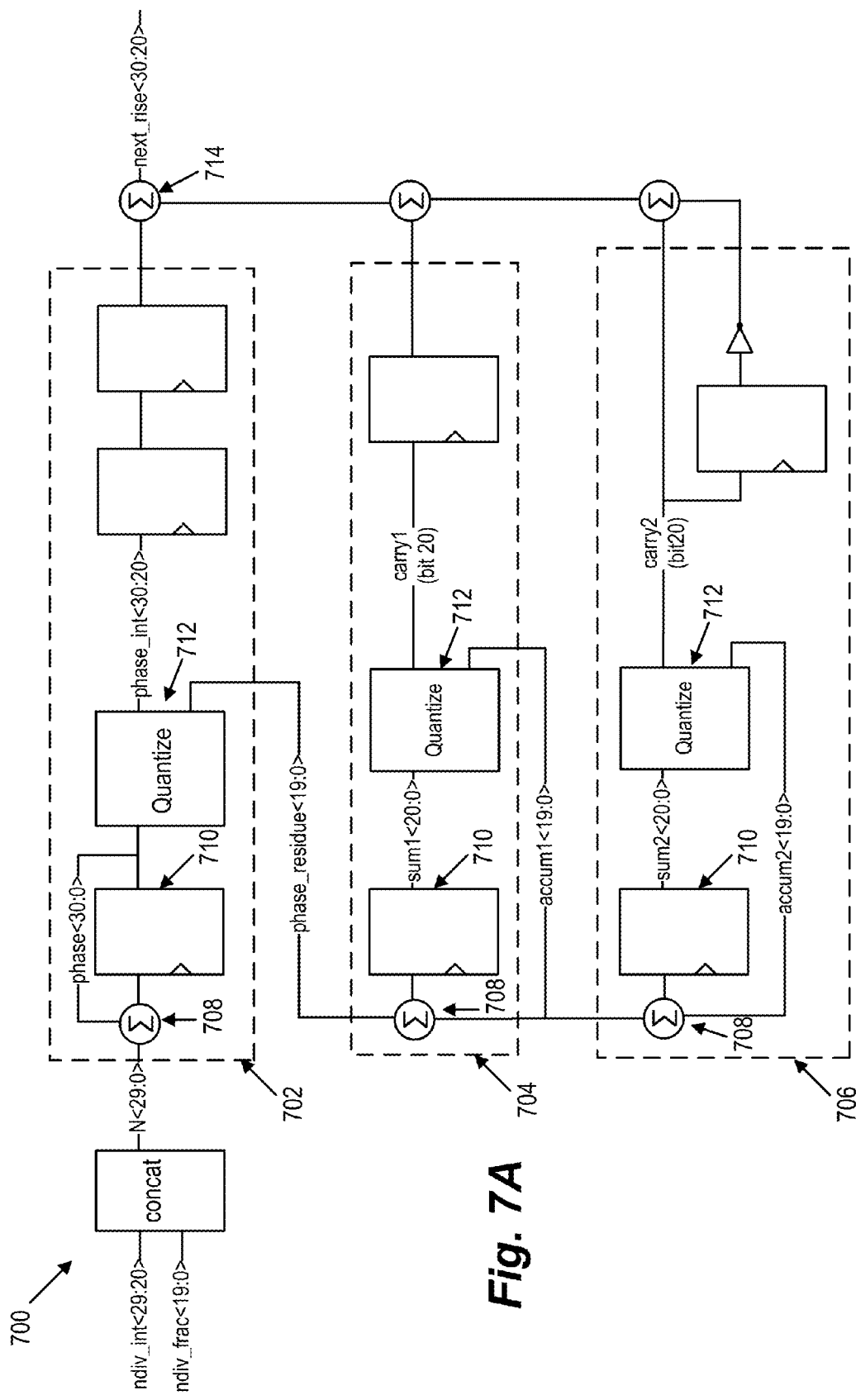
FIGS. 7A and 7B are exemplary schematic illustrations of sigma-delta modulators, according to certain embodiments.

FIG. 7A is an exemplary schematic illustration of a sigma-delta modulator (SDM) 700, according to certain embodiments. The SDM 700 can be implemented in the PLL 600 or any other PLL described herein. In one implementation, the SDM 700 is a MASH111 SDM implemented in the phase domain. The SDM 120 includes three identical stages, 702, 704, and 706, each having a summer 708, an integrator 710 and a quantizer 712. Each stage of the SDM 120 may also include zero, one, two, or any other number of delay circuits.

In some conventional SDMs, such as the SDM 120, a fractional part of a divider value is processed by the integrator of the SDM and then added to the integer part of the divider value. However, with respect to the SDM 700, the integer part, ndiv_int<29:20>, and the fractional part, ndiv_frac<19:0> of the divider value are joined together in concatenator 710, and signal N<29:20> is input into the integrator 710 of the first stage 702 of the SDM 700. Phase residue, referred to as phase_residue<19:0>, is computed at the quantizer 712 of the first stage, which is then input into the summer 708 of each successive stage. In addition, phase error is also accumulated at the quantizer 712 of the second stage 704 and the third stage 706. The quantizer 712 of the first stage 702 also outputs an integer phase called phase_int<30:20>. The fractional part of the phase is added to the integer part of the phase at summer 714. The output of the SDM 700 is referred to as next_rise<30:20>, which is output to a counter (not shown). When the counter reaches a predetermined value corresponding to a phase associated with the fractional divider value, a clock edge is generated.

Figure 7B:
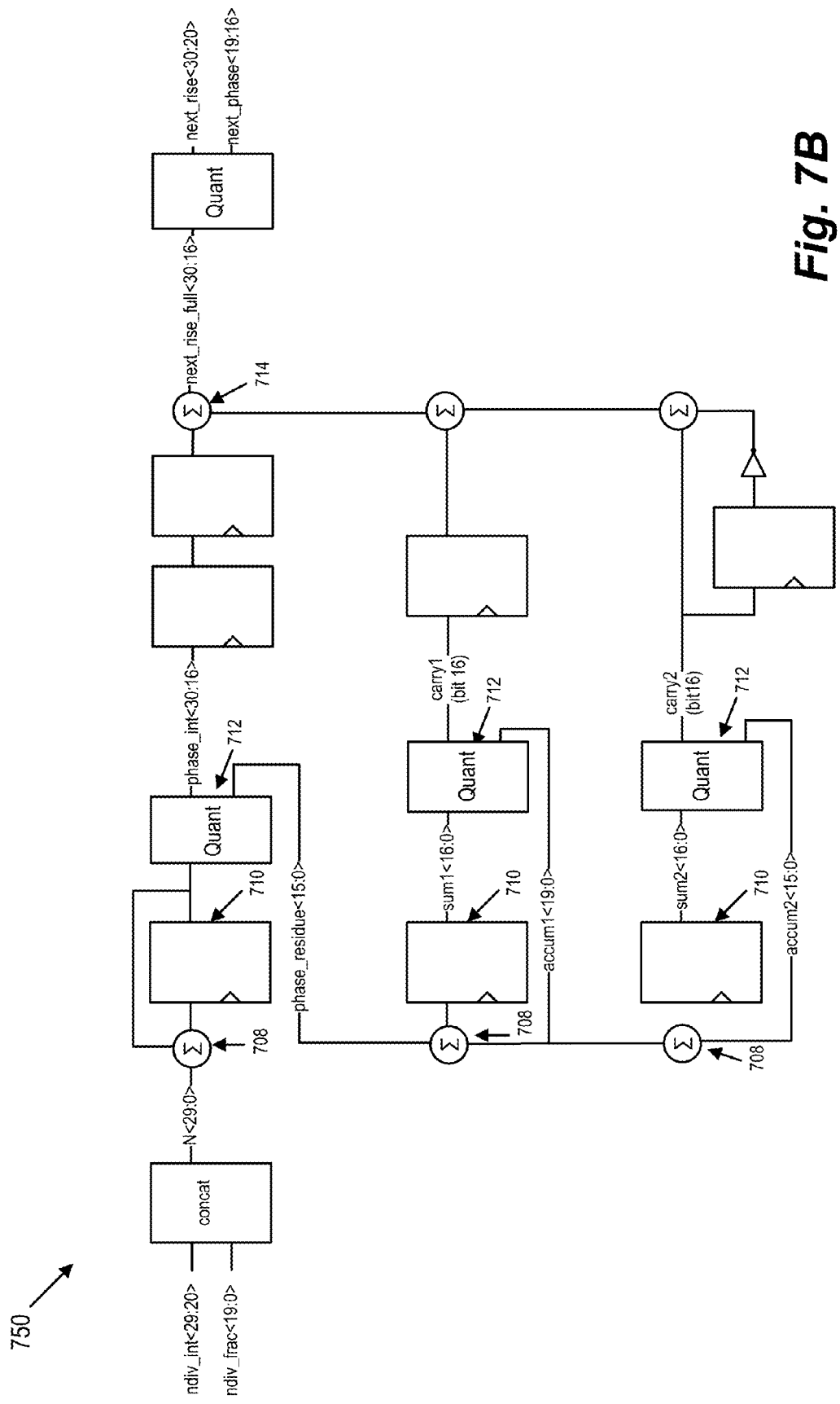

FIG. 7B is an exemplary schematic illustration of a sigma-delta modulator (SDM) 750, according to certain embodiments. The SDM 750 is a modified version of the SDM 700 that can be implemented in the PLL 600 having sixteen CPs or any other PLL having multiple charge pumps. Compared with the SDM 700 described in FIG. 7A, the quantizer 712 retains four additional bits in the integer phase output, which is phase_int<30:16>, and the phase residue output from the quantizer 712 has four fewer bits than in SDM 700, which is indicated as phase_residue<15:0>. The additional four bits retained in the integer phase output represent integer phase steps between the sixteen CPs of the PLL 600, and the SDM 750 modulates between each of the sixteen phases corresponding to the sixteen charge pumps. In addition, the SDM 750 also includes a quantizer 712 at the output of the SDM 750 that separates the next_rise_full<30:16> into a next_rise<30:20> signal and a next_phase<19:16> signal. The next_phase<19:16> signal includes the four least significant bits (lsbs) of the final output that that indicate the CPs that are driven by the earlier feedback clock and the CPs that are driven by the later feedback clock.

Figure 8:
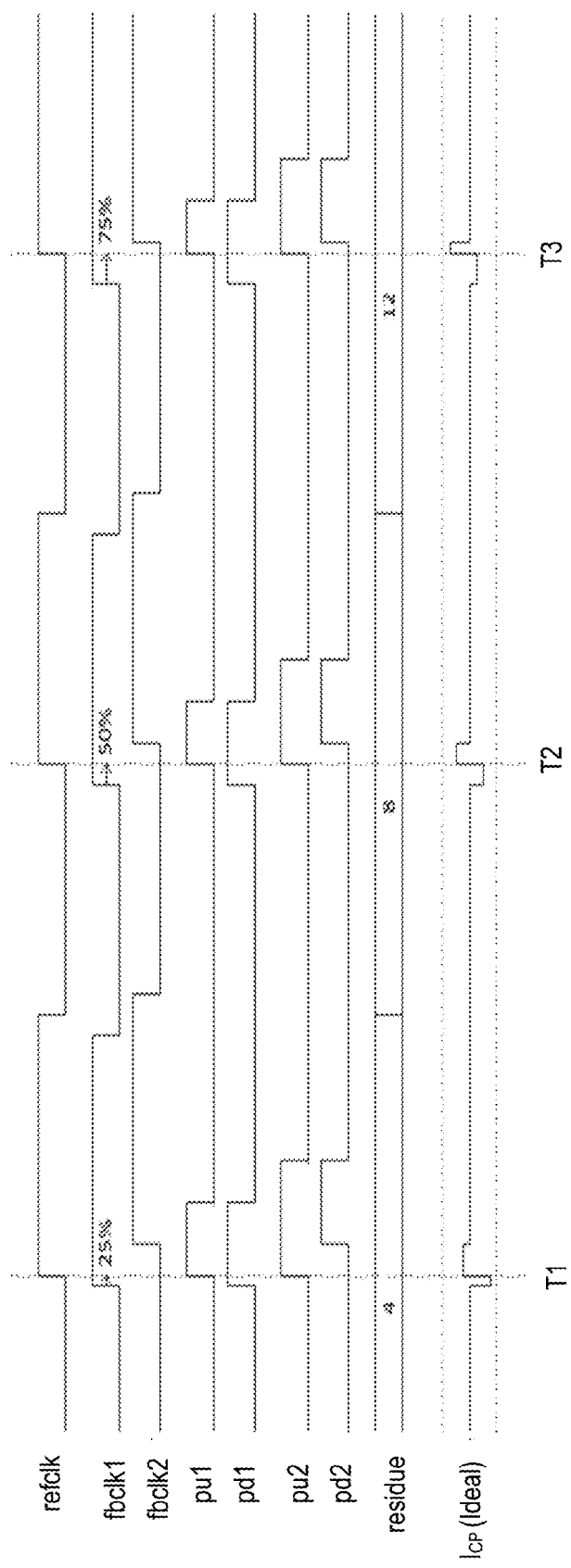
FIG. 8 is an exemplary timing diagram for a fractional phase locked loop, according to certain embodiments.

FIG. 8 is an exemplary timing diagram for the PLL 600, according to certain embodiments. The timing diagram includes the refclk signal that commences clock cycles at times T1, T2, and T3. The timing diagram also includes signals for fbclk1, fbclk2, pu1, pd1, pu2, pd2, SDM residue, and ideal $I_{CP}$. The pu1/pd1 signals are output from the PFD1 based on the refclk and fbclk1 input signals, and the pu2/pd2 signals are output from the PFD2 based on the refclk and fbclk2 input signals. For the PLL 600 described by the timing diagram of FIG. 8, the fractional offset applied by the SDM 700 or 750 is equal to 25% or ¼, which means that the fbclks will alternately lead and lag the refclk by 0%, 25%, 50%, and 75%.

At time T1, for the first rising refclk, the refclk is closest to fbclk1, which is the earlier of the two fbclks. The SDM residue is equal to 4, which means that the PLL 600 generates a virtual fbclk that is 25% of the distance from fbclk1 to fbclk2. For example, four of the multiplexers select the pu2/pd2 signal output from PFD2, and twelve of the multiplexers select the pu1/pd1 signal output from PFD1. The total CP current, $I_{CP}$, output from the sixteen CPs is approximately −0.75 times the vcoclk period ($T_{VCO}$) plus 0.25 times the $T_{VCO}$, which results in a net charge of zero input into the LF and no phase error in the PLL 600.

At time T2, the second rising refclk is equally spaced between fbclk1 and fbclk2. The SDM residue is equal to 8, which means that the PLL 600 generates a virtual fbclk that is 50% of the distance from fbclk1 to fbclk2. For example, eight of the multiplexers select the pu2/pd2 signal output from PFD2, and eight of the multiplexers select the pu1/pd1 signal output from PFD1. The total CP current, $I_{CP}$, output from the sixteen CPs is approximately −0.50 times the vcoclk period ($T_{VCO}$) plus 0.50 times the $T_{VCO}$, which results in a net charge of zero input into the LF and no phase error in the PLL 600.

At time T3, the third rising refclk lags fbclk1 by 75%, which means that the refclk is closest to fbclk2. The SDM residue is equal to 12, which means that the PLL 600 generates a virtual fbclk that is 75% of the distance from fbclk1 to fbclk2. For example, twelve of the multiplexers select the pu2/pd2 signal output from PFD2, and four of the multiplexers select the pu1/pd1 signal output from PFD1. The total CP current, $I_{CP}$, output from the sixteen CPs is approximately −0.75 times the vcoclk period ($T_{VCO}$) plus 0.25 times the $T_{VCO}$, which results in a net charge of zero input into the LF and no phase error in the PLL 600.

In other exemplary implementations, the fractional offset applied by the SDM 700 or 750 is equal to 6.25%, or ¹⁄₁₆, which is referred to as Integer16 mode of the PLL 600. For each successive refclk cycle, the phase reside output from the SDM 700 incrementally increases by an integer value of one so that the PLL 600 steps through each of the sixteen CPs with each successive refclk cycle. For example, when the phase reside is equal to one, fifteen of the multiplexers select the pu1/pd1 signal output from PFD1, and one of the multiplexers selects the pu2/pd2 signal output from PFD2. At the next successive refclk cycle, when the phase residue is equal to two, fourteen of the multiplexers select the pu1/pd1 signal output from PFD1, and two of the multiplexers select the pu2/pd2 signal output from PFD2.

In some implementations where the SDM 750 is used in the PLL 600 for the implementation of the Integer16 mode, the next_phase<19:16> signal output from the SDM 750 acts as a counter that incrementally steps through the sixteen CPs, and the calculated phase residue is equal to zero.

Figure 9A:
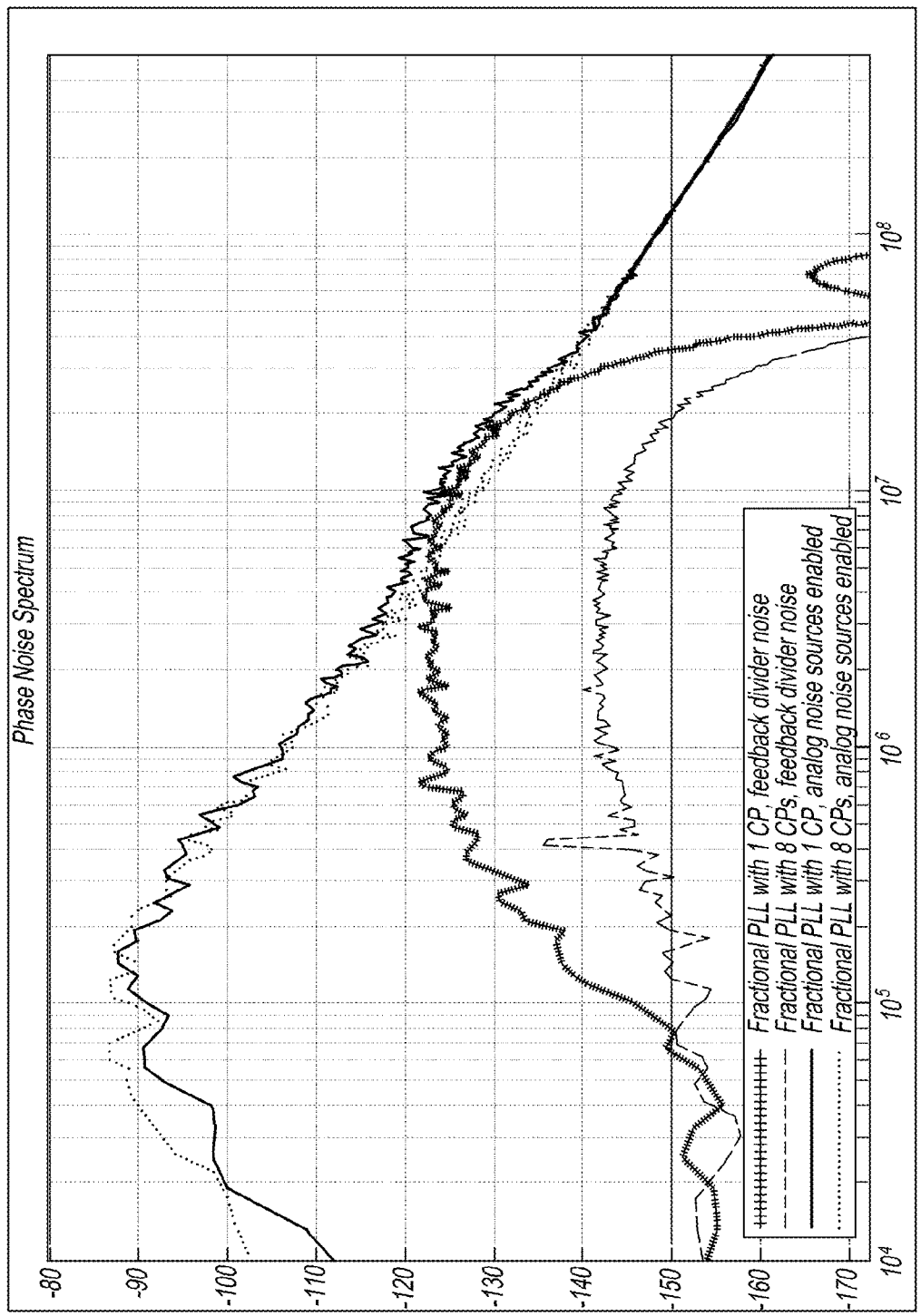
FIGS. 9A and 9B are exemplary graphs of a phase noise spectrum for fractional phase locked loops, according to certain embodiments.

FIG. 9A is an exemplary graph of a phase noise spectrum for the PLL 600, according to certain embodiments. The graph in FIG. 9A shows feedback divider noise curve in Decibels (dB) for frequencies from $10^4$ Hertz (Hz) to greater than $10^8$ Hz for a fractional PLL with one CP, such as the PLL 100 described by FIG. 1A, as well as a feedback divider noise curve for the PLL 600 having eight CPs. The feedback divider noise for the PLL 600 is reduced by 18 dB as compared to the PLL 100. In addition, the phase noise mask is reduced in a frequency region of 10-20 MHz, which allows loop bandwidth to be increased in order to further minimize jitter without increasing the phase noise between 10-20 MHz. In certain embodiments, the reduction in feedback divider noise can be described by the equation, 20 log(m), where m is the number of CPs used in the PLL 600. The graph also shows phase noise graphs for the PLL 100 and the PLL 600 with analog noise sources enabled.

Figure 9B:
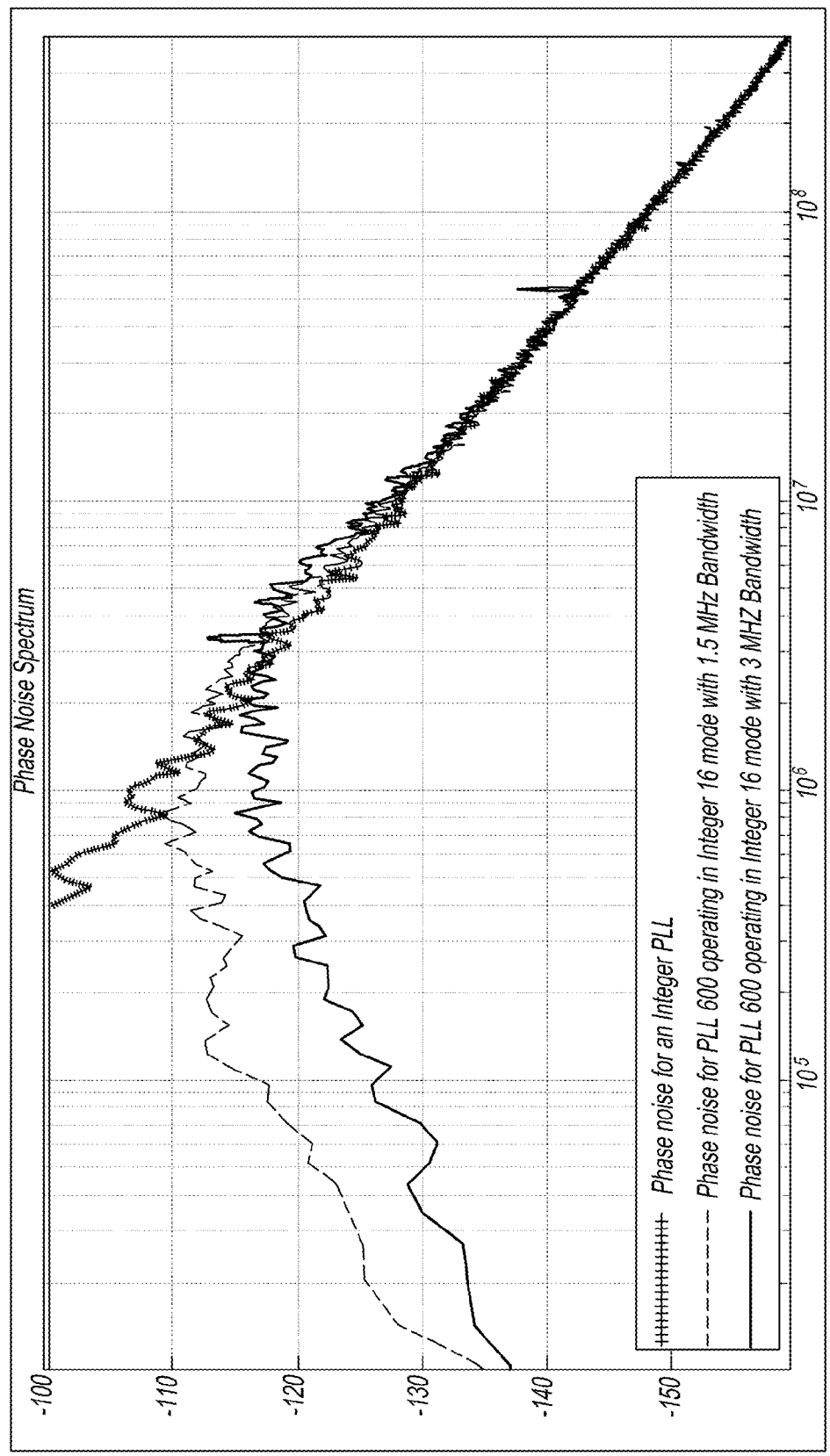

FIG. 9B is an exemplary graph of a phase noise spectrum for the PLL 600 in Integer16 mode, according to certain embodiments. The graph in FIG. 9B shows phase noise curves in dB for frequencies from $10^4$ Hz to greater than $10^8$ Hz for an integer PLL, a PLL 600 having a 1.5 MHz bandwidth, and a PLL having a 3 MHz bandwidth. In some implementations, performance of the Integer16 mode of the PLL 600 approaches performance levels of integer PLLs while still outputting signals at fractional division rates of the refclk signal.

For example, at an optimal bandwidth of 1.5 MHz for the PLL 600 operating in the Integer16 mode, the phase noise is approximately half the phase noise for a conventional fractional PLL, such as the PLL 100. The phase noise for the PLL 600 operating in the Integer16 mode is also approximately 1.5 times greater than the phase noise for an integer PLL. If the bandwidth is increased to 3 MHz, the phase noise for the PLL 600 is reduced, but phase noise spurs appear at frequencies equal to the refclk frequency divided by 16 ($F_{ref}/16$). In addition, if the number of CPs used in the PLL 600 in either Integer16 mode or another mode and/or fractional division rate were increased to 32, 64, or a larger number, the phase noise exhibited by the PLL 600 would be further reduced until the phase noise for the PLL 600 is approximately equal to the phase noise for an integer PLL.

Figure 10:
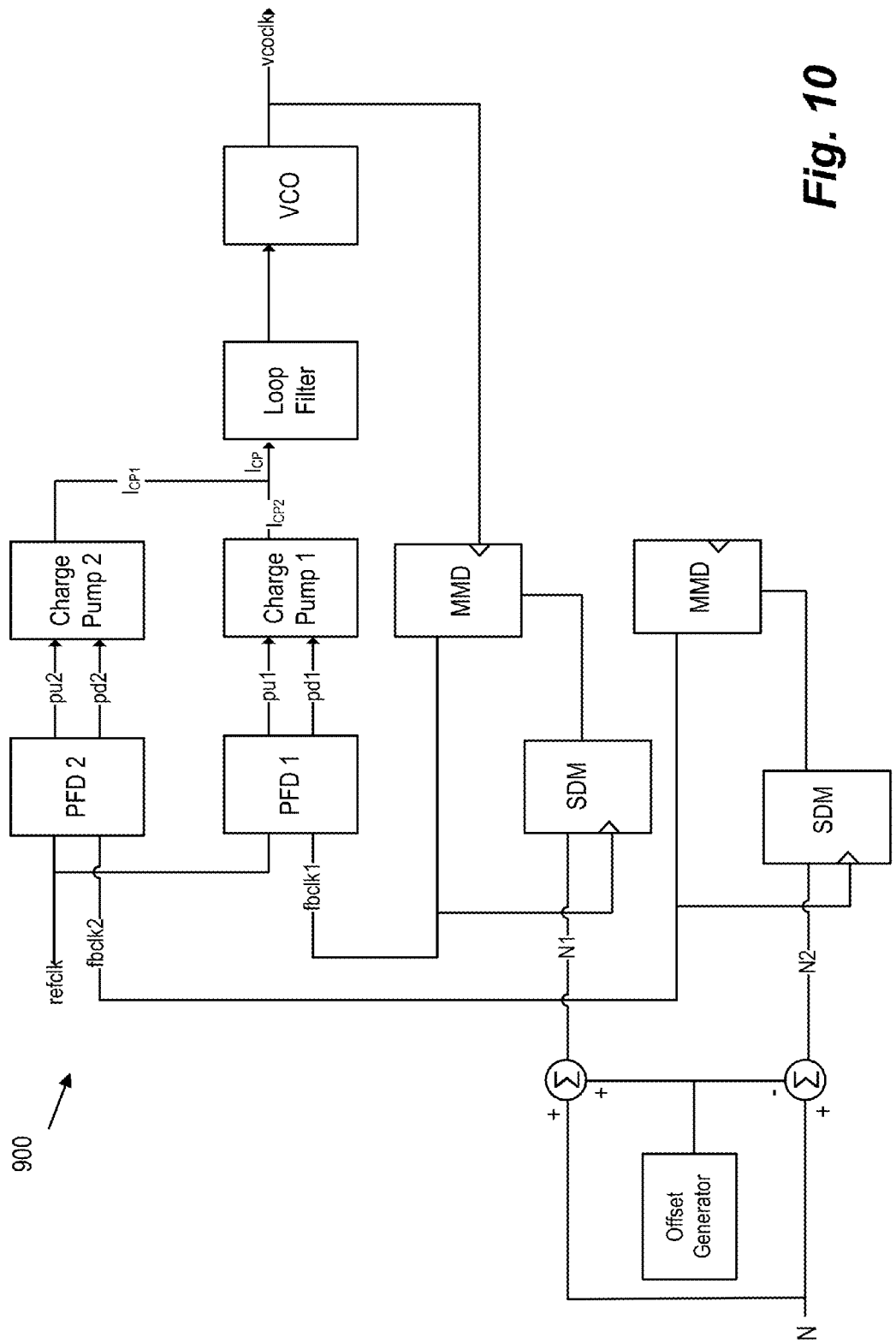
FIG. 10 is an exemplary schematic diagram for a fractional phase locked loop, according to certain embodiments.

FIG. 10 is a schematic illustration of an exemplary fractional PLL 900 having multiple charge pumps, according to certain embodiments. The PLL 900 has two feedback clocks, fbclk1 and fbclk2, that are input into one of two PFDs (PFD1 and PFD2) with the refclk signal also being input into each of the two PFDs. With respect to PLL 900, the pu/pd signals output from PFD1 are referred to as pu1/pd1, and the pu/pd signals output from PFD2 are referred to as pu2/pd2. The output currents from a first CP and a second CP, $I_{CP1}$ and $I_{CP2}$, are summed into a total $I_{CP}$, which is input into the LF, and the output signal from the LF is input into the VCO. In other implementations, the PLL 900 can include more than two CPs, PFDs, and feedback clocks.

The feedback loop of the PLL 900 includes two MMDs, two SDMs, and circuitry for generating fbclk1 and fbclk2 and the desired frequencies. In some implementations, at small fractional offsets (e.g., offset sizes of approximately $N=Integer+/-2^{-X}$), the SDMs generate spurs in the signals output from the SDMs, which are narrow frequencies having higher phase noise than surrounding frequencies. In order to mitigate the spurious effects of the SDMs, the PLL 900 includes offset generation circuitry in order to generate fbclk1 and fbclk2 such that the feedback clocks are equally modulated above and below a center frequency. In addition, fbclk1 and fbclk2 are also generated to have oppositely modulated phases. For example, the offset generator adds an amount of phase and frequency offset, N1, to one of the feedback clocks and subtracts an equal amount of phase and frequency offset, N2, from the other feedback clock. As the PLL 900 operates, the frequencies of fbclk1 and fbclk2 bounce back and forth with respect to each other. By generating the equal and opposite phase and frequency offsets, SDM patterns can be generated for frequencies that are greater than or less than N without producing spurs at the fractional offset points.

Figure 11:
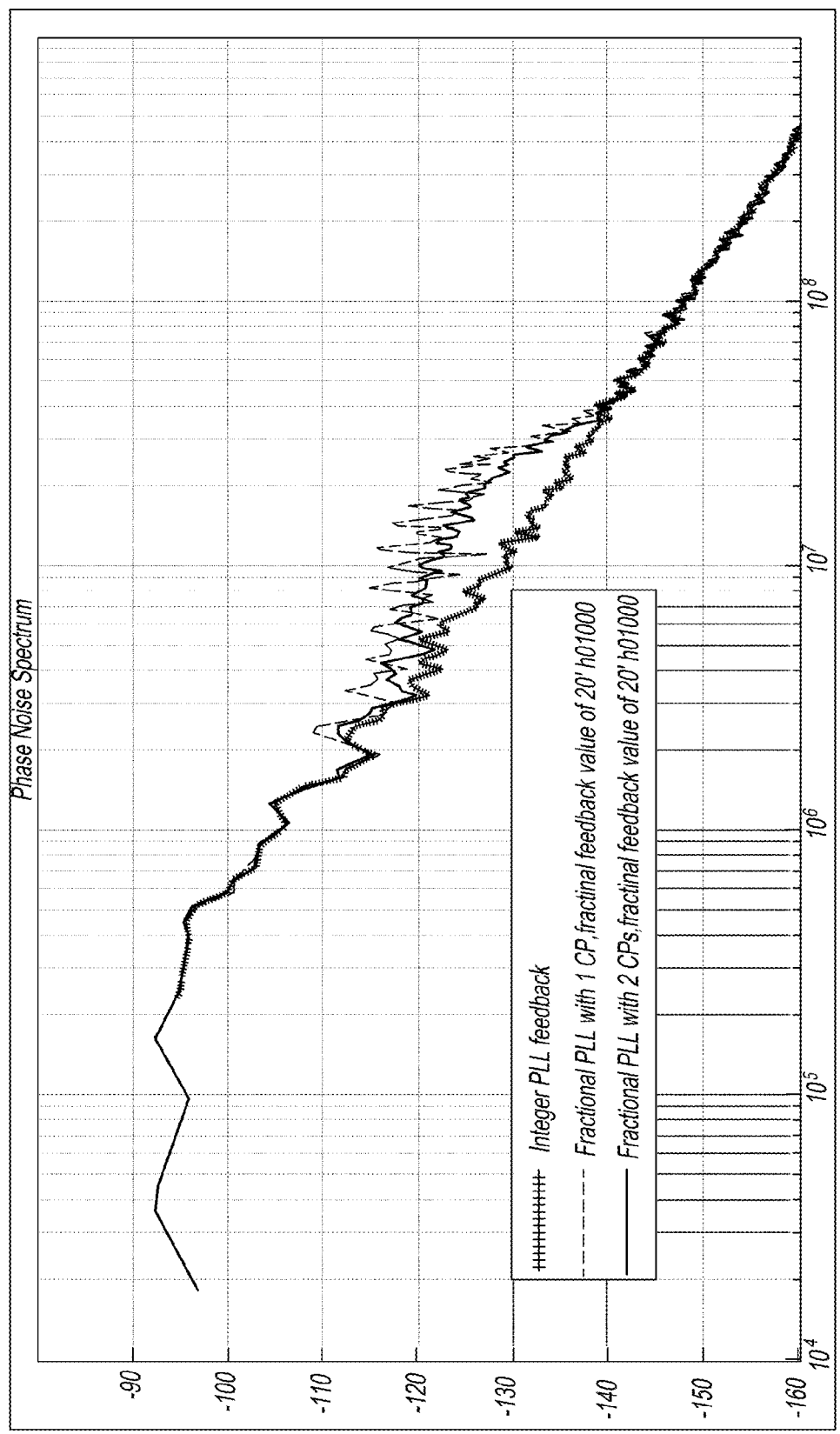
FIG. 11 is an exemplary graph of a phase noise spectrum for fractional phase locked loops, according to certain embodiments.

FIG. 11 is an exemplary graph of a phase noise spectrum for fractional phase locked loops, according to certain embodiments. The graph in FIG. 11 shows phase noise curves in dB for frequencies from $10^4$ Hz to greater than $10^8$ Hz for an integer PLL, a fractional PLL with one CP, such as the PLL 100 described by FIG. 1A, as well as a phase noise curve for the PLL 900 having 2 CPs. As shown in the graph, the phase noise for the integer PLL represents an approximate minimum phase noise that can be attained by fractional PLLs, according to certain embodiments. The phase noise curve for the PLL 100 represents the phase noise for a fractional feedback value of 20'h01000 for an ideal PLL with one CP. The phase noise curve for the PLL with two CPs represents the phase noise for a fractional feedback value of 20'h01000 for the PLL 900. For the PLL 900, the phase noise is reduced in the 10-20 MHz region as compared with the phase noise for the PLL 100.

Figure 12:
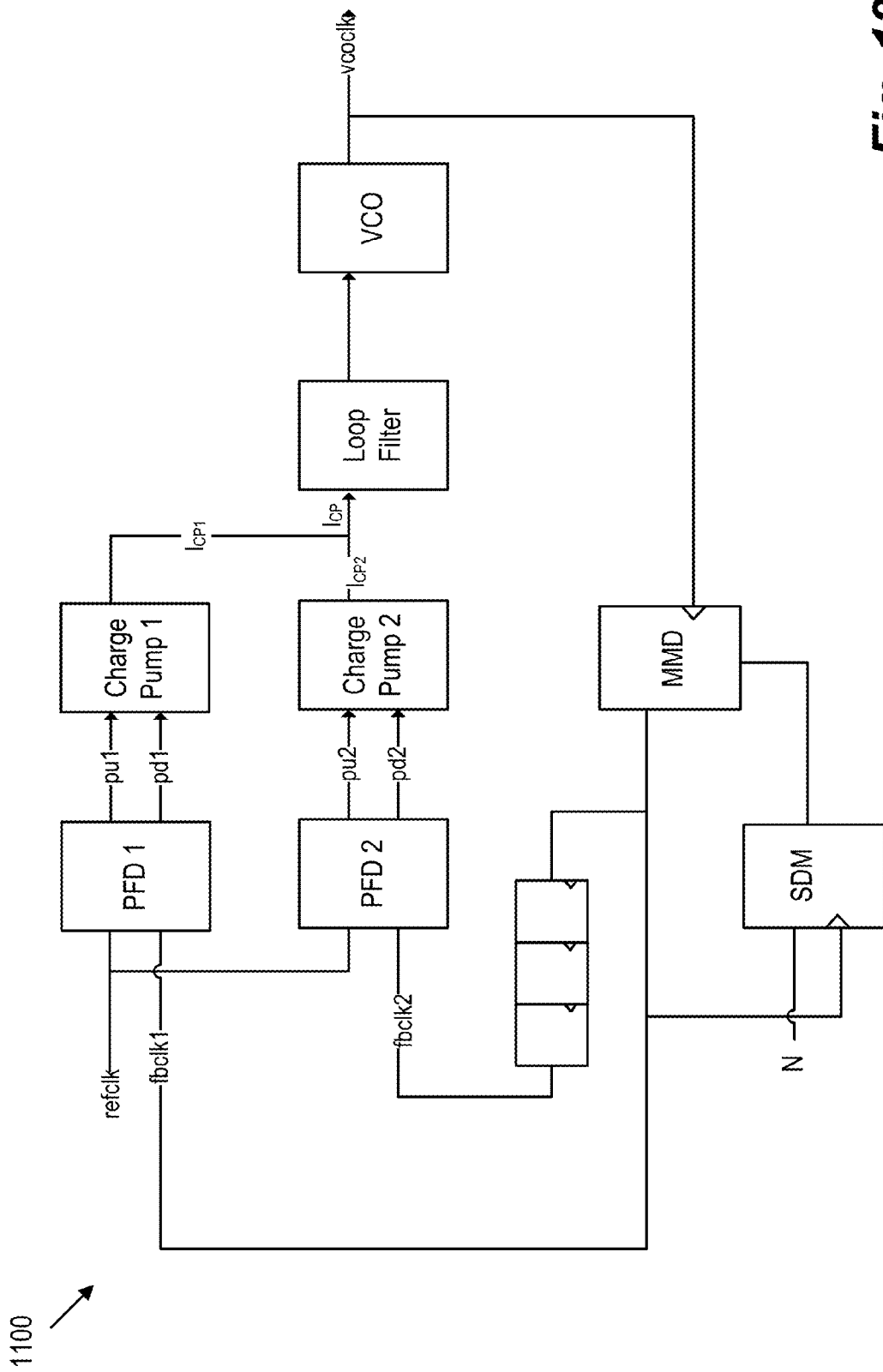
FIG. 12 is an exemplary schematic diagram for a fractional phase locked loop, according to certain embodiments.

FIG. 12 is an exemplary schematic diagram for a fractional phase locked loop 1100 having multiple charge pumps, according to certain embodiments. The PLL 1100 has two feedback clocks, fbclk1 and fbclk2, that are input into one of two PFDs (PFD1 and PFD2) with the refclk signal also being input into each of the two PFDs. With respect to PLL 1100, the pu/pd signals output from PFD1 are referred to as pu1/pd1, and the pu/pd signals output from PFD2 are referred to as pu2/pd2. The output currents from a first CP and a second CP, $I_{CP1}$ and $I_{CP2}$, are summed into a total $I_{CP}$, which is input into the LF, and the output signal from the LF is input into the VCO. In other implementations, the PLL 1100 can include more than two CPs, PFDs, and feedback clocks.

The feedback loop of the PLL 1100 includes a MMD, SDM, and circuitry to generate the feedback clocks such that one feedback clock lags the other feedback clock by a predetermined integer number of vcoclk cycles. For example, the PLL 1100 includes three flip-flops that delay fbclk2 by three vcoclk cycles behind fbclk1. The delay between fbclk1 and fbclk2 ensures that the CPs operate in the linear gain region because one feedback clock leads reference clock and one feedback clock lags reference clock for each clock cycle. The PLL 1100 can include fewer or greater numbers of flip-flops based on a desired amount of delay between fbclk1 and fbclk2.

For example, the amount of delay between the feedback clocks can be based on the amount of modulation applied by the SDM. Each level of modulation applied by the SDM uses different maximum phase step sizes, so the amount of offset between fbclk1 and fbclk2 is determined so that when the later clock, such as fbclk2, leads the reference clock, and the earlier clock, such as fbclk1, lags the reference clock, fbclk1 and fbclk2 do not cross a center frequency where the reference clock operates. In some implementations, the amount of offset between fbclk1 and fbclk2 is increased based on an increase in noisiness at the reference clock. In addition, the PLL 1100 can reduce an amount of output jitter without creating unwanted noise spurs. According to some aspects, jitter is a measure of stability and/or deviation of an output signal from a circuit, such as a PLL.

Figure 13:
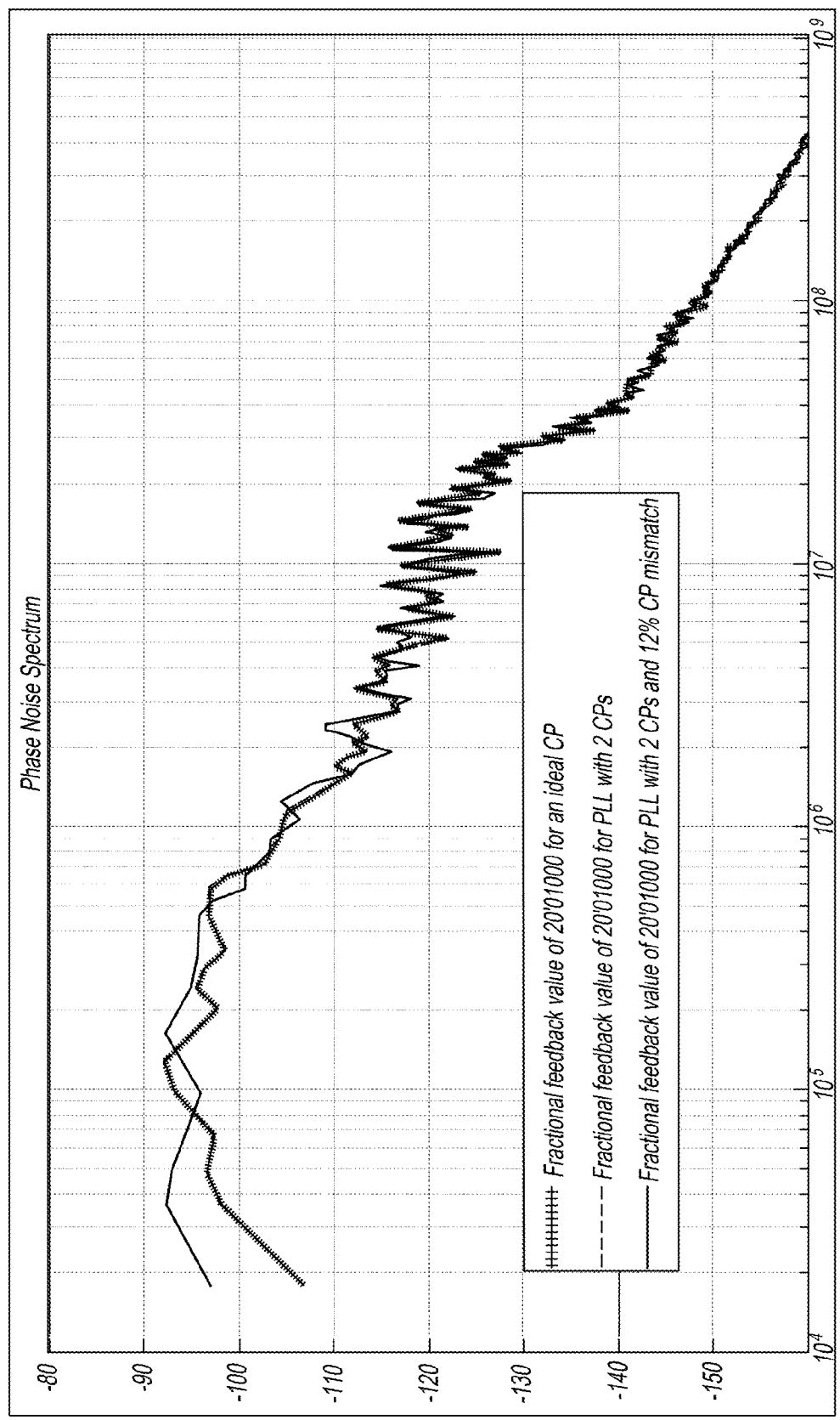
FIG. 13 is an exemplary graph of a phase noise spectrum for fractional phase locked loops, according to certain embodiments.

FIG. 13 is an exemplary graph of a phase noise spectrum for fractional phase locked loops, according to certain embodiments. The graph in FIG. 12 shows phase noise curves in dB for frequencies from $10^4$ Hz to greater than $10^8$ Hz for an ideal fractional PLL with one CP such as the PLL 100, a phase noise curve for the PLL 1100 having 2 CPs, and a phase noise curve for the PLL 1100 with a 12% CP mismatch. In some aspects, CP mismatch refers to a difference in output current between the UP and DOWN switches in CP, which may be caused by differences in drain-source voltages within the PMOS and NMOS FETs within the CP. As shown in the graph, the phase noise for the ideal fractional PLL and the PLL 1100 over the displayed range of frequencies are approximately equal with a jitter of approximately 0.31 root mean square picoseconds (ps rms).

In addition, the phase noise curve for the PLL 1100 with the 12% CP mismatch has a jitter of approximately 0.32 ps. The PLL 1100 provides an improvement in jitter as compared to the PLL 100 with a 12% CP mismatch, which outputs signals having a jitter of approximately 0.53 ps rms. In addition, the PLL 1100 provides the improvement in jitter without producing spurs at the reference clock frequency. For example, in some implementations where a bleeding current is used in a PLL to mitigate jitter due to CP mismatch, spurs may be produced at the reference clock frequency.

FIGS. 14A-14D are exemplary illustrations of circuits for overcoming timing mismatches between feedback clocks in fractional PLLs with multiple CPs, according to certain embodiments. In fractional PLL circuits with more than one feedback clock, timing mismatches between the feedback clocks can occur, which generates spurs in the output signals based on the amount of mismatch between the feedback clocks.

Figure 14A:
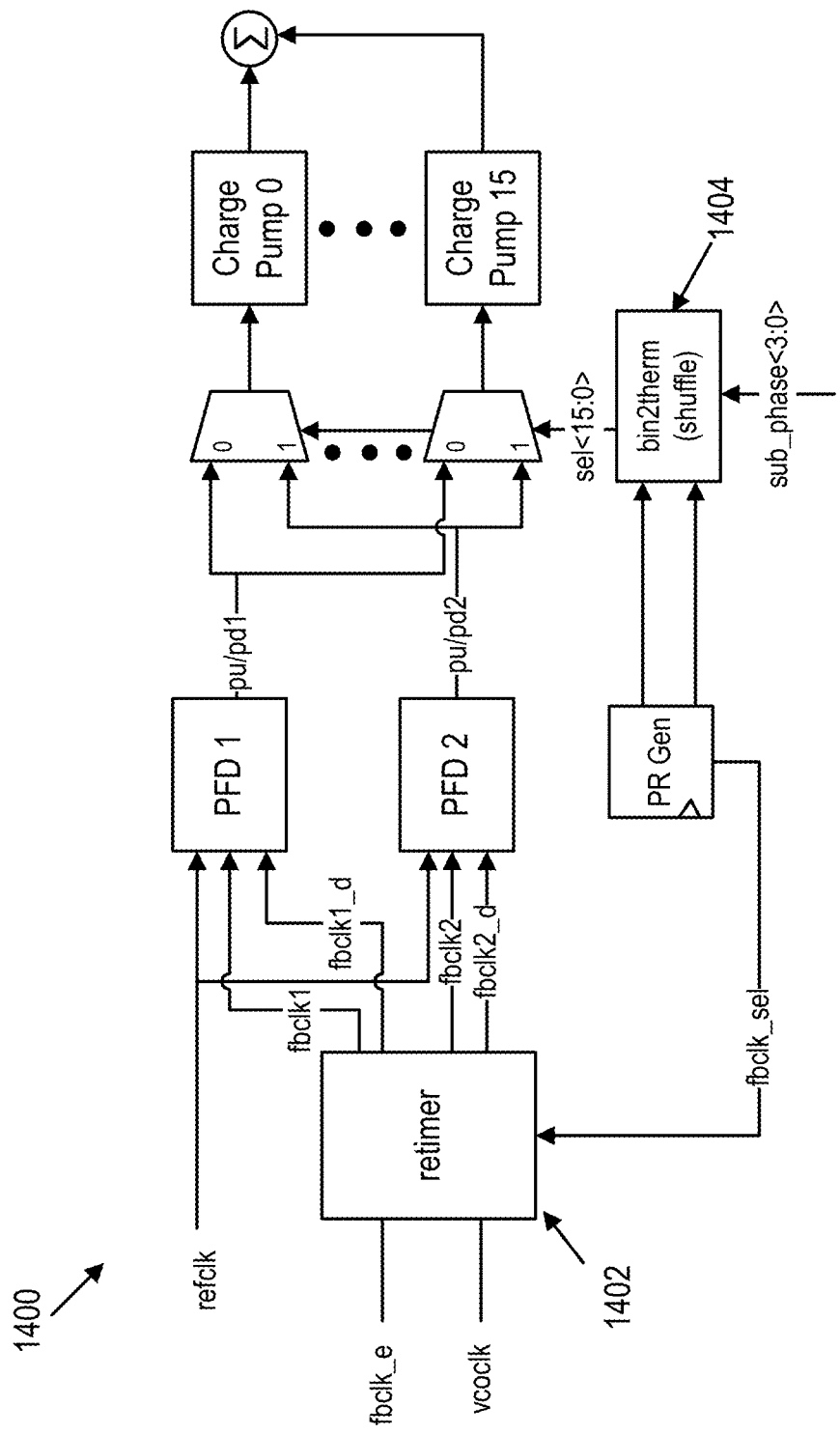
FIGS. 14A-14D are exemplary illustrations of circuits for overcoming timing mismatches between feedback clocks in fractional phase locked loops with multiple charge pumps, according to certain embodiments.

FIG. 14A is an overview timing mismatch mitigation circuit 1400, according to certain embodiments. The timing mismatch mitigation circuit 1400 can be inserted into any of the fractional PLL circuits having multiple CPs, such as the PLL 600. The timing mismatch mitigation circuit 1400 toggles between the selection of early and late feedback clocks in the fractional PLL, which reduces the noise spurs that are generated at the PLL offset frequencies. The timing mismatch mitigation circuit 1400 includes a retimer circuit 1402, a bin2therm shuffler 1404, a pseudorandom generator (PRN), sixteen CPs and associated multiplexers, and two three-input PFDs, PFD1 and PFD2. The retimer circuit 1402 receives inputs of vcoclk, feedback clock selector signal, fbclk_sel, and a feedback clock enable signal, fbclk_e. The bin2therm shuffler 1404 receives inputs from the pseudorandom generator and the phase residue from the SDM 700 or 750. Details regarding the retimer circuit 1402 and the bin2therm shuffler 1404 are discussed further herein.

In some implementations, three-input PFDs are used in fractional PLL circuits to promote operation in the linear gain regions for the PFDs and CPs, which reduces the jitter in the output signals from the fractional PLLs. Delay feedback clocks for each PFD, fbclk1_d and fbclk2_d, lag fbclk1 and fbclk2 in order to reset the PU and PD signals for PFD1 and PFD2. In addition, the pseudorandom generator produces two pseudorandom sequences: a first pseudorandom sequence randomizes a selection between fbclk1 and fbclk2, and a second pseudorandom sequence to control which CPs are selected during the shuffling operation.

Figure 14B:
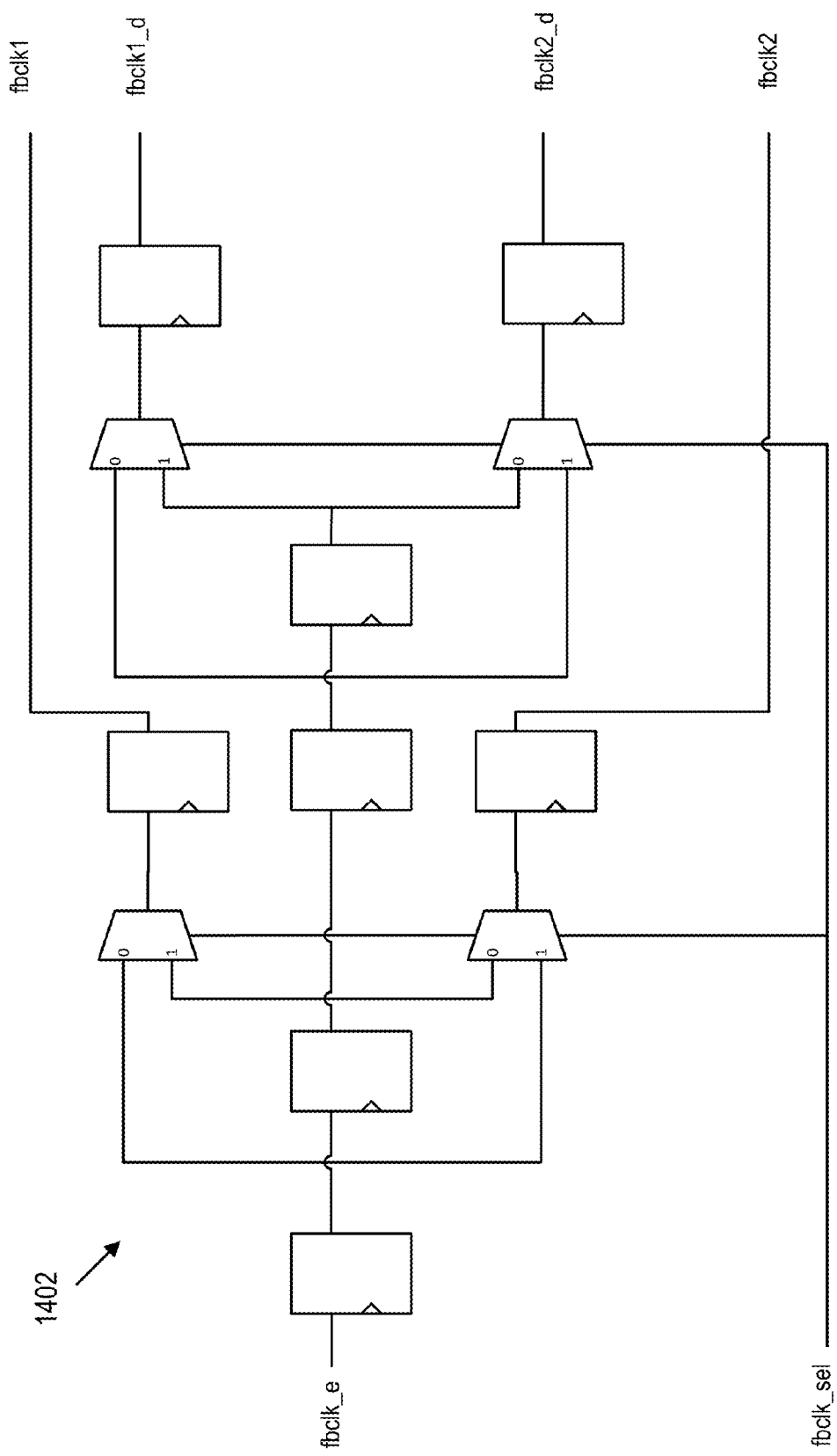

FIG. 14B is an exemplary illustration of the retimer circuit 1402, according to certain embodiments. The retimer circuit 1402 can include at least one of the feedback clock selector signal, fbclk_sel, and the feedback clock enable signal, fbclk_e. The retimer circuit 1402 also includes one or more flip-flops and/or multiplexers that produce the fbclk1, fbclk1_d, fbclk2, and fbclk2_d. The fbclk_sel input is used to swap the timing of fbclk1 and fbclk2 along with fbclk1_d and fbclk2_d.

Figure 14C:
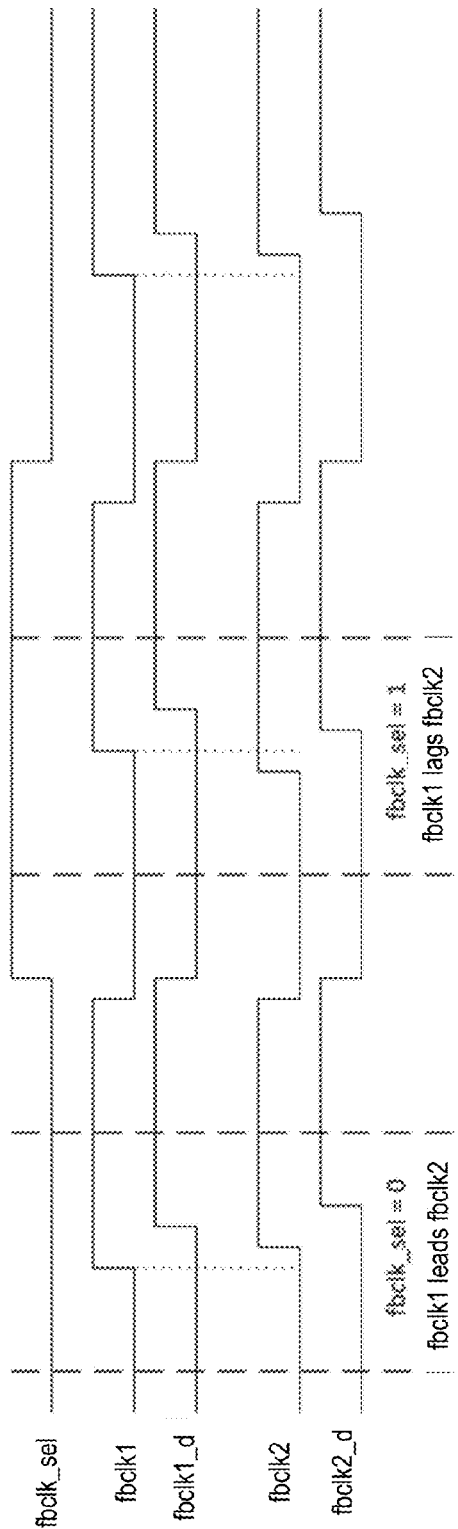

FIG. 14C is an exemplary timing diagram of the retimer circuit 1402, according to certain embodiments. The timing diagram of FIG. 14C includes waveforms for the fbclk_sel, fbclk1, fbclk1_d, fbclk2, and fbclk2_d signals. When fbclk_sel is equal to zero, fbclk1 leads fbclk2 by $T_{VCO}$. When fbclk_sel is equal to one, fbclk1 lags fbclk2 by $T_{VCO}$. Delayed signals fbclk1_d and fbclk2_d lag fbclk1 and fbclk2 by a predetermined number of $T_{VCO}$ cycles and reset the PU and PD signals for PFD1 and PFD2.

Figure 14D:
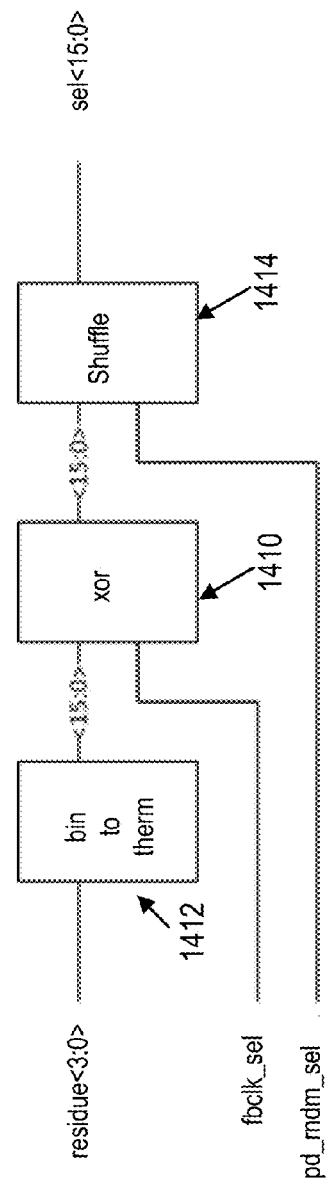

FIG. 14D is an exemplary illustration of the bin2therm/shuffler circuit 1404, according to certain embodiments. An exclusive-or (XOR) 1410 module is inserted between the bin2therm decoder 1412 and the shuffler 1414. The phase residue, residue<3:0>, output from the SDM 700 or 750 of the PLL is input into the bin2therm decoder 1412. The pd_rndm_sel signal is output from a pseudorandom generator and ensures that unique sets of CPs are selected at each reference clock cycle. The fbclk_sel signal is input into the XOR module 1410 to invert the selected bits. For example, if fbclk_sel is set to zero, and residue<3:0> is equal to seven, then seven of the sixteen CP selector bits are set to high, selecting fbclk2. The remaining nine CP selector bits are set to low, selecting fbclk1. If fbclk_sel is set to one, then seven of the sixteen CP selector bits are set to low, selecting fbclk1, which is now the later fbclk signal. The remaining nine CP selector bits are set to high, selecting fbclk2, which is now the earlier fbclk signal. The selector bits output from the bin2therm/shuffler circuit 1404 are referred to as sel<15:00>.

Figure 15:
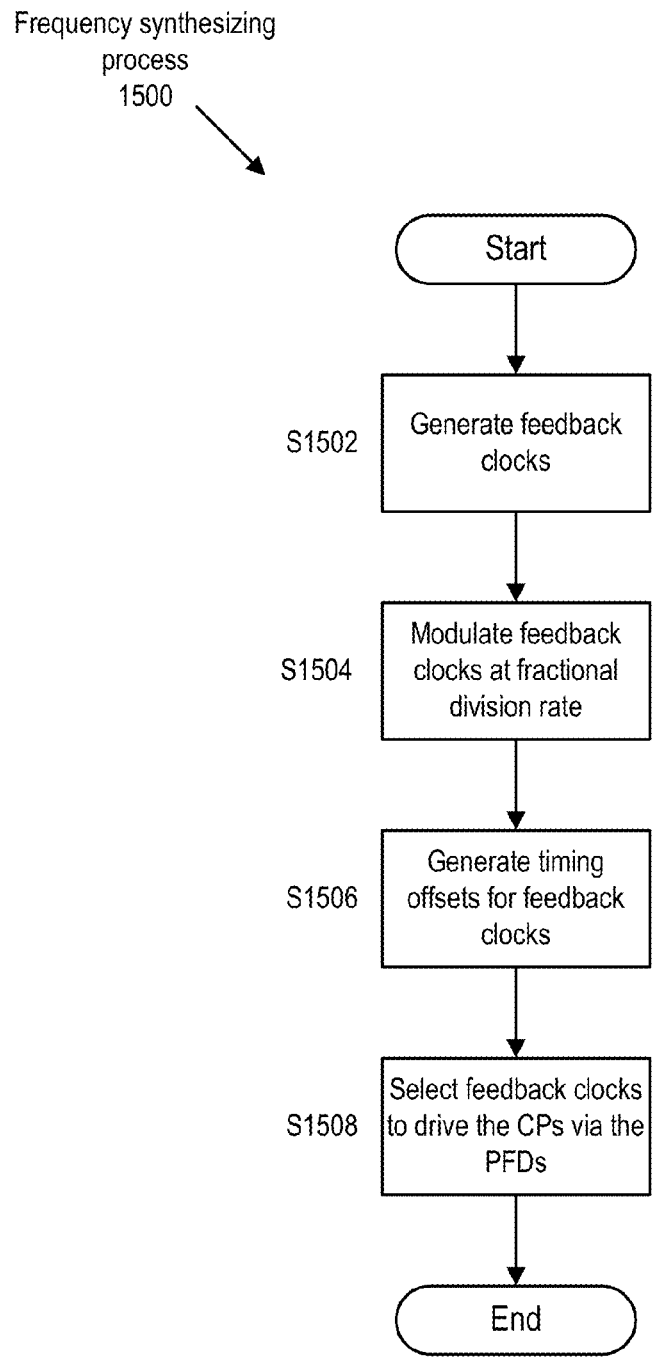
FIG. 15 is an exemplary flowchart of a frequency synthesizing process, according to certain embodiments.

FIG. 15 is an exemplary flowchart of a frequency synthesizing process 1500, according to certain embodiments. At step S1502, two or more feedback clocks are generated to be input into the two or more PFDs. One or more MMDs produce an output clock, where the time between output clocks is an integer multiple of the input clock period, which is the vcoclk signal in the case of the fractional PLLs described herein. Some PLLs, such as the PLL 600, 650, and 1100, have one MMD in the feedback loop that generates a feedback clock based on an input of the vcoclk signal. The output signal from the MMD can be split into two or more feedback clocks with one or more timing offsets. In addition, the PLL 900 has two MMDs that each generate feedback clock signals based on the vcoclk input and the equal and opposite fractional-N divider values produced at the SDMs based on a phase and frequency offset determined at an the offset generator.

At step S1504, the one or more SDMs in the PLL modulate feedback clock signals at the fractional division rate, N, based on the fractional offset that produces a desired frequency output from the VCO. The fractional offset represents a rational multiple of the reference clock frequency to produce the desired output vcoclk frequency and can include an integer and a fractional part that is input into the SDM 700 or 750, as previously discussed. The SDM 700 or 750 outputs a fractional-N divider value that is input into the one or more MMDs. In addition, the phase residue computed at the SDM 700 or 750 is used to determine the number of CPs that are driven by earlier feedback clocks and later feedback clocks.

At step S1506, timing offsets are generated for the two or more feedback clocks. For example, in the case of the PLL 600, fbclk2 is delayed one clock cycle behind fbclk1 based on the shift circuit in the fbclk2 input signal line to PFD2. In addition, for PLL 900, three flip-flops are added in series in the fbclk2 input signal line to PFD so that fbclk2 lags fbclk1 by three clock cycles. In some implementations, the timing offsets are generated for the two or more feedback clocks so that that equal numbers of feedback clocks lead and lag the reference clock for each refclk cycle in order to ensure that the PFDs and CPs operate in their linear gain regions, which reduces phase noise and output signal jitter.

At step S1508, the two or more feedback clocks associated with the two or more PFDs are selected to drive the two or more CPs. In some implementations where the PLL includes two feedback clocks, the PFDs are selected so that the outputs from the two or more CPs are determined based on both early and late feedback clocks. For the example of the PLL 600, the pu/pd signals are output from PFD1 and PFD2 to two or more multiplexers that select one of the output signals from PFD1 and PFD2. Each multiplexer has a corresponding CP, and the output signals selected by the multiplexers are input into the corresponding CPs.

In an exemplary embodiment, the PLL 600 includes sixteen CPs and sixteen multiplexers, but greater or fewer number of CPs and multiplexers can also be used, such as 4, 8, 32, 64, and the like. The number of multiplexers selecting PFD1 and the number of multiplexers selecting PFD2 are based on the residue output from the SDM 700 or 750. Also, a bin2therm shuffler circuit designates which of the multiplexers select the pu/pd signal from PFD1 and which of the multiplexers select the pu/pd signal from PFD2. Other types of shuffler circuits can also be used to determine the multiplexers and CPs that select the pu/pd signal from PFD1 and the pu/pd signal from PFD2.

A number of implementations of fractional PLL circuits with multiple charge pumps have been described herein. With the multiple charge pumps driven by early and late feedback clocks and associated circuitry for achieving fractional division rates, performance of the fractional PLLs approaches performance levels of optimized integer PLLs based on a reduction in phase noise, spurs, and jitter that results from operating the CPs and PFDs in their linear gain regions.

Figure 16:
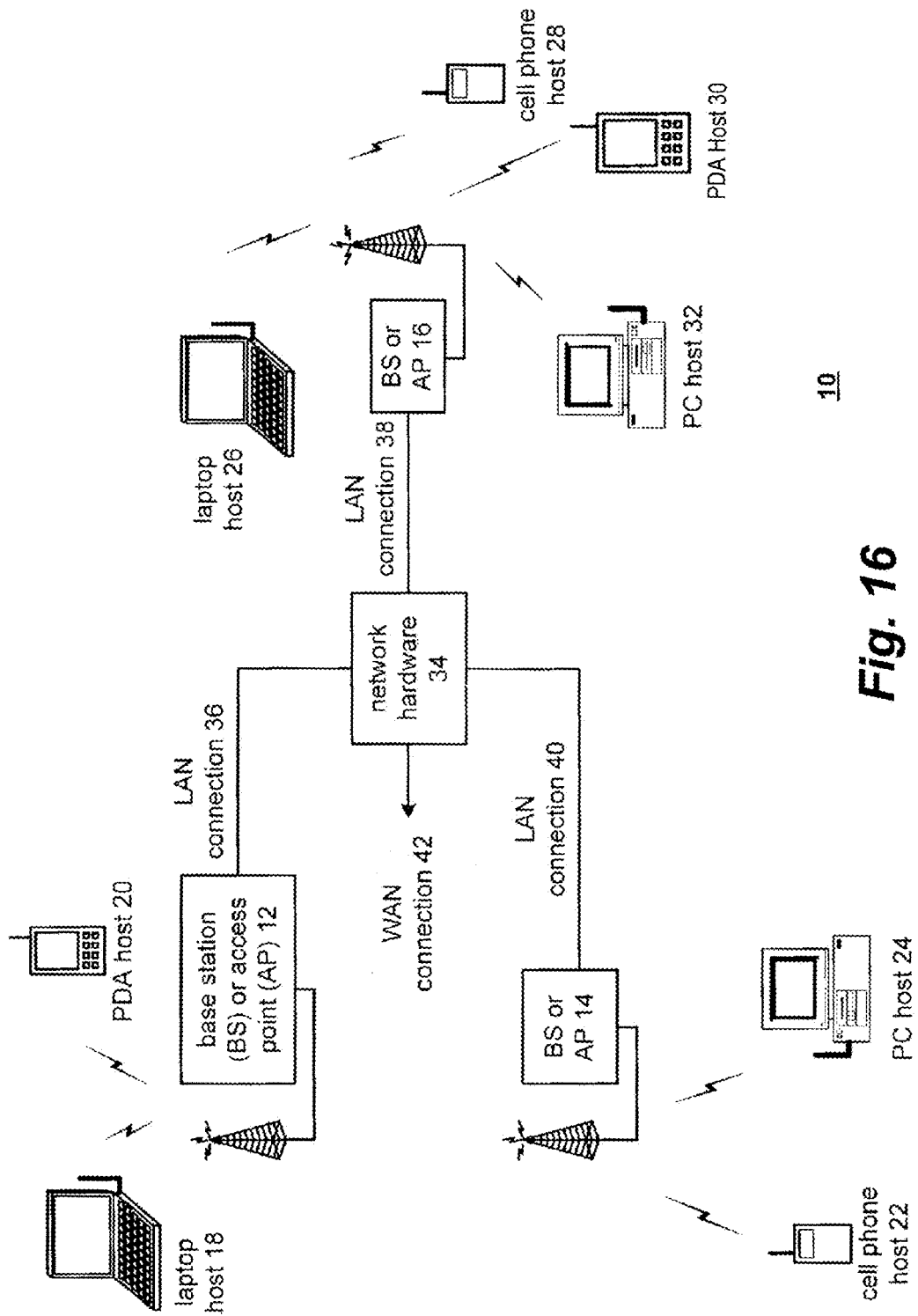
FIG. 16 is an exemplary schematic block diagram of a wireless communication system, according to certain embodiments.
Figure 17:
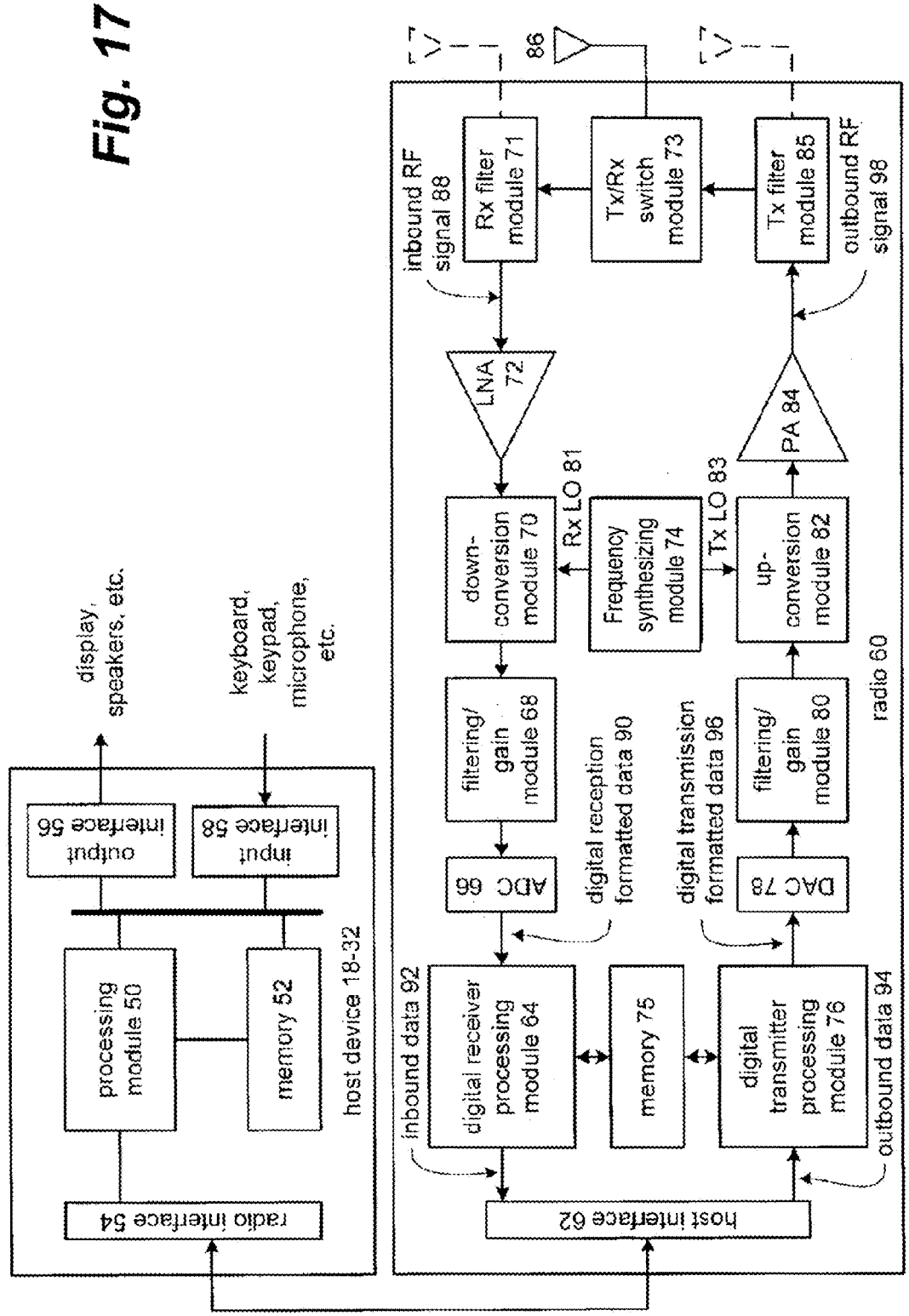
FIG. 17 is an exemplary schematic block diagram of a wireless communication device, according to certain embodiments.

FIGS. 16 and 17 describe an exemplary communication system in which frequency synthesizers, such as the fractional PLLs described herein, can be implemented. FIG. 16 is a schematic block diagram illustrating a communication system 10 that includes a plurality of base stations and/or access points 12-16, a plurality of wireless communication devices 18-32 and a network hardware component 34. The wireless communication devices 18-32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 17.

The base stations or access points 12-16 are operably coupled to the network hardware 34 via local area network connections 36, 38 and 40. The network hardware 34, which may be a router, switch, bridge, modem, system controller, et cetera provides a wide area network connection 42 for the communication system 10. Each of the base stations or access points 12-16 has an associated antenna or antenna array to communicate with the wireless communication devices in its area. Typically, the wireless communication devices register with a particular base station or access point 12-14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a highly linear amplifier and/or programmable multi-stage amplifier as disclosed herein to enhance performance, reduce costs, reduce size, and/or enhance broadband applications.

FIG. 17 is a schematic block diagram illustrating a wireless communication device that includes the host device 18-32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18-32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, et cetera such that the received data may be displayed. The radio interface 54 also provides data from the processing module 50 to the radio 60. The processing module 50 may receive the outbound data from an input device such as a keyboard, keypad, microphone, et cetera via the input interface 58 or generate the data itself. For data received via the input interface 58, the processing module 50 may perform a corresponding host function on the data and/or route it to the radio 60 via the radio interface 54.

Radio 60 includes a host interface 62, digital receiver processing module 64, an analog-to-digital converter 66, a filtering/attenuation module 68, an IF mixing down conversion stage 70, a receiver filter 71, a low noise amplifier 72, a transmitter/receiver switch 73, a frequency synthesizing module 74, memory 75, a digital transmitter processing module 76, a digital-to-analog converter 78, a filtering/gain module 80, an IF mixing up conversion stage 82, a power amplifier 84, a transmitter filter module 85, and an antenna 86. The antenna 86 may be a single antenna that is shared by the transmit and receive paths as regulated by the Tx/Rx switch 73, or may include separate antennas for the transmit path and receive path. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 64 and/or 76 implements one or more of its functions via a state machine, analog circuitry, digital circuitry, and/or logic circuitry, the memory storing the corresponding operational instructions is embedded with the circuitry including the state machine, analog circuitry, digital circuitry, and/or logic circuitry.

In operation, the radio 60 receives outbound data 94 from the host device via the host interface 62. The host interface 62 routes the outbound data 94 to the digital transmitter processing module 76, which processes the outbound data 94 in accordance with a particular wireless communication standard (e.g., IEEE 802.11a, IEEE 802.11b, Bluetooth, et cetera) to produce digital transmission formatted data 96. The digital transmission formatted data 96 will be a digital base-band signal or a digital low IF signal, where the low IF typically will be in the frequency range of one hundred kilohertz to a few megahertz.

The digital-to-analog converter 78 converts the digital transmission formatted data 96 from the digital domain to the analog domain. The filtering/gain module 80 filters and/or adjusts the gain of the analog signal prior to providing it to the IF mixing stage 82. The IF mixing stage 82 directly converts the analog baseband or low IF signal into an RF signal based on a transmitter local oscillation 83 provided by frequency synthesizing module 74, which may be implemented in accordance with the teachings of the present disclosure. The power amplifier 84 amplifies the RF signal to produce outbound RF signal 98, which is filtered by the transmitter filter module 85. The antenna 86 transmits the outbound RF signal 98 to a targeted device such as a base station, an access point and/or another wireless communication device.

The radio 60 also receives an inbound RF signal 88 via the antenna 86, which was transmitted by a base station, an access point, or another wireless communication device. The antenna 86 provides the inbound RF signal 88 to the receiver filter module 71 via the Tx/Rx switch 73, where the Rx filter 71 bandpass filters the inbound RF signal 88. The Rx filter 71 provides the filtered RF signal to low noise amplifier 72, which amplifies the signal 88 to produce an amplified inbound RF signal. The low noise amplifier 72 provides the amplified inbound RF signal to the IF mixing module 70, which directly converts the amplified inbound RF signal into an inbound low IF signal or baseband signal based on a receiver local oscillation 81 provided by frequency synthesizing module 74, which may be implemented in accordance with the teachings of the present disclosure. The down conversion module 70 provides the inbound low IF signal or baseband signal to the filtering/gain module 68. The filtering/gain module 68 filters and/or gains the inbound low IF signal or the inbound baseband signal to produce a filtered inbound signal.

The analog-to-digital converter 66 converts the filtered inbound signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host device 18-32 via the radio interface 54.

As one of ordinary skill in the art will appreciate, the wireless communication device of FIG. 17 may be implemented using one or more integrated circuits. For example, the host device may be implemented on one integrated circuit, the digital receiver processing module 64, the digital transmitter processing module 76 and memory 75 may be implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of the host device and the digital receiver and transmitter processing modules 64 and 76 may be a common processing device implemented on a single integrated circuit. Further, the memory 52 and memory 75 may be implemented on a single integrated circuit and/or on the same integrated circuit as the common processing modules of processing module 50 and the digital receiver and transmitter processing module 64 and 76.

A number of implementations have been described. Nevertheless, it will be understood that various modifications may be made without departing from the spirit and scope of this disclosure. For example, preferable results may be achieved if the steps of the disclosed techniques were performed in a different sequence, if components in the disclosed systems were combined in a different manner, or if the components were replaced or supplemented by other components.

The invention claimed is:

1. A frequency synthesizer comprising:
circuitry configured to
generate two or more feedback clocks based on oscillation signals output from a voltage-controlled oscillator;
modulate the two or more feedback clocks based on fractional offsets from a reference clock frequency for input into a plurality of phase and frequency detectors (PFDs) driving a plurality of charge pumps; and
select an output from one of the plurality of PFDs corresponding to an early feedback clock input that leads a reference clock or a late feedback clock input that lags the reference clock to drive each of the plurality of charge pumps,
wherein the circuitry is further configured to randomize selections of the plurality of charge pumps associated with the early feedback clock and late feedback clock.

2. The frequency synthesizer of claim 1, wherein the circuitry is further configured to select the early feedback clock or the late feedback clock to drive the plurality of charge pumps based on a calculated phase residue output from a sigma-delta modulator.

3. The frequency synthesizer of claim 1, wherein a net charge of the currents output from the plurality of charge pumps is equal to zero.

4. The frequency synthesizer of claim 1, wherein
an amount of fractional offset corresponds to a quantity of charge pumps; and
the circuitry is configured to incrementally step through one or more phases of the early feedback clock and the late feedback clock at a rate based on the amount of fractional offset.

5. The frequency synthesizer of claim 4, wherein the amount of fractional offset is equal to $1/16$ and quantity of charge pumps is equal to sixteen.

6. The frequency synthesizer of claim 1, wherein the circuitry is further configured to modulate an integer part and a fractional part of the fractional offsets.

7. The frequency synthesizer of claim 6, wherein the circuitry is further configured to generate clock edges for the two or more feedback clocks at phases corresponding to the fractional offsets.

8. The frequency synthesizer of claim 7, wherein the circuitry is further configured to modulate between one or more integer values indicating a number of selected charge pumps.

9. The frequency synthesizer of claim 1, wherein the circuitry is further configured to delay one or more of the feedback clocks by a number of the oscillation signals output from the voltage-controlled oscillator.

10. The frequency synthesizer of claim 1, wherein the two or more charge pumps and the two or more phase and frequency detectors operate in linear gain regions.

11. The frequency synthesizer of claim 1, wherein the circuitry is further configured to filter signals output from the plurality of charge pumps based on an amount of phase noise present in the oscillation signals output from the voltage-controlled oscillator.

12. The frequency synthesizer of claim 1, wherein a sum of outputs from the plurality of charge pumps corresponds to a weighted offset between one or more charge pumps driven by the early feedback clock and one or more charge pumps driven by the late feedback clock.

13. The frequency synthesizer of claim 1, wherein the circuitry is further configured to select the early feedback clock or the late feedback clock to drive the plurality of charge pumps based on a predetermined number of additional bits retained in an integer phase output of a sigma-delta modulator indicating a first number of charge pumps driven by the early feedback clock and a second number of charge pumps driven by the late feedback clock.

14. The frequency synthesizer of claim 13, wherein four additional bits are retained in the integer phase output of the sigma-delta modulator to indicate the first number of charge pumps driven by the early feedback clock and the second number of charge pumps driven by the late feedback clock.

15. A frequency synthesizer comprising:
  circuitry configured to
    generate two or more feedback clocks based on oscillation signals output from a voltage-controlled oscillator;
    modulate the two or more feedback clocks based on fractional offsets from a reference clock frequency for input into a plurality of phase and frequency detectors (PFDs) driving a plurality of charge pumps; and
    toggle between an early feedback clock and a late feedback clock driving the plurality of charge pumps based on a feedback clock selector signal.

16. The frequency synthesizer of claim 15, wherein the circuitry is further configured to randomize selection of the early feedback clock and the late feedback clock.

17. The frequency synthesizer of claim 15, wherein the circuitry is further configured to randomize selections of the plurality of charge pumps driven by the early feedback clock or the late feedback clock.

18. The frequency synthesizer of claim 15, wherein the circuitry is further configured to reset outputs of the plurality of PFDs via a delayed feedback clock signal associated with each of the early feedback clock and the late feedback clock.

19. A frequency synthesizer comprising:
  circuitry configured to
    generate two or more feedback clocks based on oscillation signals output from a voltage-controlled oscillator;
    modulate the two or more feedback clocks based on fractional offsets from a reference clock frequency for input into a plurality of phase and frequency detectors (PFDs) driving a plurality of charge pumps; and
    modulate an early feedback clock and a late feedback clock at equal and opposite phase and frequency offsets from a center frequency.

* * * * *